US009672389B1

(12) United States Patent
Mosterman et al.

(10) Patent No.: US 9,672,389 B1
(45) Date of Patent: Jun. 6, 2017

(54) GENERIC HUMAN MACHINE INTERFACE FOR A GRAPHICAL MODEL

(71) Applicant: The MathWorks, Inc., Natick, MA (US)

(72) Inventors: Pieter J. Mosterman, Framingham, MA (US); Peter S. Szpak, Newton, MA (US); Jay R. Torgerson, Hopkinton, MA (US); Daniel F. Higgins, Hopkinton, MA (US); Paul F. Kinnucan, Milton, MA (US)

(73) Assignee: The MathWorks, Inc., Natick, MA (US)

( * ) Notice: Subject to any disclaimer, the term of this patent is extended or adjusted under 35 U.S.C. 154(b) by 493 days.

(21) Appl. No.: 13/730,092

(22) Filed: Dec. 28, 2012

Related U.S. Application Data

(63) Continuation-in-part of application No. 13/533,841, filed on Jun. 26, 2012, now Pat. No. 9,117,039.

(51) Int. Cl.
*G06F 3/048* (2013.01)
*G06G 7/48* (2006.01)

(52) U.S. Cl.
CPC ............... *G06G 7/48* (2013.01); *G06F 3/048* (2013.01); *A63F 2300/1025* (2013.01); *A63F 2300/64* (2013.01); *A63F 2300/8082* (2013.01)

(58) Field of Classification Search
None
See application file for complete search history.

(56) References Cited

U.S. PATENT DOCUMENTS

| 6,028,593 | A | * | 2/2000 | Rosenberg et al. ........... 345/156 |
| 7,464,373 | B1 |   | 12/2008 | Yunt et al. |
| 7,523,023 | B1 |   | 4/2009 | Koh et al. |
| 7,925,611 | B1 | * | 4/2011 | Bromley ............ G05B 19/409 706/11 |
| 8,954,187 | B1 |   | 2/2015 | Mylet |
| 8,954,195 | B2 | * | 2/2015 | Summer et al. ............. 700/264 |
| 2001/0037190 | A1 |   | 11/2001 | Jung |
| 2002/0010655 | A1 | * | 1/2002 | Kjallstrom ...................... 705/27 |
| 2002/0080139 | A1 | * | 6/2002 | Koo et al. ...................... 345/473 |
| 2003/0093768 | A1 |   | 5/2003 | Suzuki |

(Continued)

OTHER PUBLICATIONS

Wikipedia "3D printing", May 25, 2012, 9 pages.*

(Continued)

*Primary Examiner* — Kibrom K Gebresilassie
(74) *Attorney, Agent, or Firm* — Harrity & Harrity, LLP

(57) ABSTRACT

A computing device may receive a request to create a link between a control mechanism of a human machine interface and an attribute of a model. The model, when executed, may simulate behavior of a system. The human machine interface may correspond to a physical object. The request may include information identifying the attribute and information identifying the control mechanism. The computing device may create a link between the control mechanism and the attribute based on receiving the request. The computing device may further observe the control mechanism in a spatial environment and detect that the control mechanism has changed based on observing the control mechanism. The computing device may modify a value, associated with the attribute, based on detecting that the control mechanism has changed and based on the link.

20 Claims, 14 Drawing Sheets

(56) References Cited

U.S. PATENT DOCUMENTS

| | | | |
|---|---|---|---|
| 2004/0083451 A1* | 4/2004 | Abowd | G06F 17/5009 717/106 |
| 2005/0044372 A1 | 2/2005 | Aull et al. | |
| 2005/0105793 A1* | 5/2005 | Sorek et al. | 382/154 |
| 2005/0256694 A1 | 11/2005 | Taylor | |
| 2005/0257195 A1 | 11/2005 | Morrow et al. | |
| 2005/0278162 A1 | 12/2005 | Ciolfi et al. | |
| 2006/0008151 A1 | 1/2006 | Lin et al. | |
| 2006/0038816 A1* | 2/2006 | Guest et al. | 345/419 |
| 2006/0068910 A1 | 3/2006 | Schmidt et al. | |
| 2006/0150149 A1 | 7/2006 | Chandhoke et al. | |
| 2006/0167667 A1* | 7/2006 | Maturana | G05B 17/02 703/6 |
| 2006/0199167 A1* | 9/2006 | Yang et al. | 434/365 |
| 2008/0007568 A1* | 1/2008 | Chou et al. | 345/629 |
| 2008/0013793 A1* | 1/2008 | Hillis et al. | 382/114 |
| 2008/0037571 A1* | 2/2008 | Hetzel | H04L 12/2805 370/408 |
| 2008/0040703 A1 | 2/2008 | Englehart | |
| 2008/0062167 A1 | 3/2008 | Boggs et al. | |
| 2008/0098349 A1 | 4/2008 | Lin et al. | |
| 2008/0189638 A1* | 8/2008 | Mody | G05B 19/0426 715/771 |
| 2009/0036750 A1 | 2/2009 | Weinstein et al. | |
| 2009/0058799 A1* | 3/2009 | Huang et al. | 345/156 |
| 2009/0061404 A1* | 3/2009 | Toly | 434/262 |
| 2009/0073034 A1* | 3/2009 | Lin | 342/357.07 |
| 2009/0089031 A1 | 4/2009 | Sturrock et al. | |
| 2009/0157478 A1 | 6/2009 | Yang et al. | |
| 2009/0292514 A1 | 11/2009 | McKim et al. | |
| 2009/0315841 A1* | 12/2009 | Cheng et al. | 345/173 |
| 2010/0009308 A1* | 1/2010 | Wen et al. | 433/24 |
| 2011/0032255 A1* | 2/2011 | Favier et al. | 345/420 |
| 2011/0040392 A1 | 2/2011 | Hamann et al. | |
| 2011/0060463 A1* | 3/2011 | Selker | G05B 23/0221 700/266 |
| 2011/0106339 A1* | 5/2011 | Phillips et al. | 701/2 |
| 2011/0154243 A1* | 6/2011 | Styga | G06F 3/04815 715/771 |
| 2011/0205341 A1* | 8/2011 | Wilson et al. | 348/51 |
| 2011/0261083 A1* | 10/2011 | Wilson | 345/676 |
| 2012/0007891 A1* | 1/2012 | Chiang | G06F 1/1626 345/650 |
| 2012/0095575 A1* | 4/2012 | Meinherz | G05B 19/409 700/79 |
| 2012/0239169 A1 | 9/2012 | Smith et al. | |
| 2012/0254830 A1 | 10/2012 | Conrad et al. | |
| 2012/0276993 A1* | 11/2012 | Lerner et al. | 463/31 |
| 2012/0317501 A1 | 12/2012 | Milou | |
| 2012/0320080 A1* | 12/2012 | Giese et al. | 345/619 |
| 2013/0332119 A1* | 12/2013 | Santiquet et al. | 703/1 |
| 2014/0108559 A1 | 4/2014 | Grochowicz et al. | |
| 2014/0122028 A1* | 5/2014 | Aberg | G06F 17/50 703/1 |
| 2014/0132594 A1* | 5/2014 | Gharpure et al. | 345/419 |
| 2014/0157129 A1* | 6/2014 | Dinshaw et al. | 715/728 |
| 2014/0163930 A1* | 6/2014 | Balon et al. | 703/1 |
| 2014/0180644 A1 | 6/2014 | Maturana et al. | |
| 2014/0208272 A1* | 7/2014 | Vats et al. | 715/852 |
| 2014/0241347 A1 | 8/2014 | Yadav et al. | |
| 2014/0247260 A1* | 9/2014 | Ghoneima et al. | 345/419 |
| 2014/0317594 A1* | 10/2014 | He | G06F 8/38 717/105 |
| 2014/0327670 A1* | 11/2014 | Chen et al. | 345/420 |
| 2014/0365199 A1 | 12/2014 | Mosterman et al. | |

OTHER PUBLICATIONS

Wikipedia "3D printing", May 25, 2012, 9 pages (herein referred as Wikipedia).*

Wikipedia, "3D printing" http://en.wikipedia.org/wiki/3D_printing, May 25, 2012, 9 pages.

Co-pending U.S. Appl. No. 13/533,841 entitled "Generating a Three-Dimensional (3D) Report, Associated With a Model, From a Technical Computing Environment (TCE)" filed Jun. 26, 2012, by Mosterman et al., 80 pages.

Co-pending U.S. Appl. No. 13/730,159 entitled "Altering an Attribute of a Model Based on an Observed Spatial Attribute" filed Dec. 28, 2012, by Mosterman et al., 51 pages.

Co-pending U.S. Appl. No. 13/730,198 entitled "Linking of Model Elements to Spatial Elements" filed Dec. 28, 2012, by Ciolfi et al., 58 pages.

Co-pending U.S. Appl. No. 13/730,279 entitled "Interacting With a Model Via a Three-Dimensional (3D) Spatial Environment" filed Dec. 28, 2012, by Mosterman et al., 75 pages.

Nishino et al., "A Virtual Environment for Modeling 3D Objects Through Spatial Interaction," IEEE International Conference on Systems, Man, and Cybernetics, IEEE SMC'99 Conference Proceedings, vol. 6, 1999, pp. 81-86.

Laviola et al., "3D Spatial Interaction: Applications for Art, Design, and Science," SIGGRAPH 2011 Course, 2011, 75 pages.

Izadi et al., "KinectFusion: Real-time 3D Reconstruction and Interaction Using a Moving Depth Camera," Proceedings of the 24th annual ACM symposium on User interface software and technology, ACM, Oct. 16-19, 2011, pp. 559-568.

Piekarski et al, "Integrated Head and Hand Tracking for Indoor and Outdoor Augmented Reality," Virtual Reality Proceedings, IEEE, 2004, 8 pages.

Tom Simonite, "Microsoft Has an Operating System for Your House", http://www.technologyreview.com/news/517221/microsoft-has-an-operating-system-for-your-house/?utm_campaign=newsletters&utm_source=newsletter-weekly-computing&utm_medium=email&utm_content=20130718, Jul. 18, 2013, 8 pages.

Microsoft, "Microsoft Research: The Lab of Things", http://www.lab-of-things.com/, Jun. 16, 2013, 1 page.

Microsoft, "Faculty Summit 2013", http://research.microsoft.com/en-us/events/fs2013/, Jul. 16, 2013, 2 pages.

Microsoft, "HomeOS: Enabling smarter homes for everyone", http://research.microsoft.com/en-us/projects/homeos/, Jun. 22, 2011, 3 pages.

Wikipedia, "Plug and Play," http://en.wikipedia.org/wiki/Plug_and_play, Dec. 29, 2014, 6 pages.

Co-pending U.S. Appl. No. 14/611,773 entitled "Automatic Generation of Models From Detected Hardware" filed Feb. 2, 2015, by Mosterman et al., 66 pages.

Lee, Yong-Gu, et al., "Immersive modeling system (IMMS) for personal electronic products using a muti-model interface," Computer-Aided Design 42.5 (2010); pp. 387-401.

Ohshima, Toshikazu, et al., "A mixed reality system with visual and tangible interaction capability-application to evaluating automobile interior design," Proceedings of the 2nd IEEE/ACM International Symposium on Mixed and Augmented Reality, IEEE Computer Society, 2003, 2 pages.

McKinney, Kathleen, et al., "Interactive 4D-CAD," Proceeding of the third Congress on Computing in Civil Engineering, ASCE, Anaheim, CA, Jun. 1996, 9 pages.

Kordon, Mark, et al., "Model-based engineering design pilots at jpl," IEEEAC paper 1678 (2007), 21 pages.

* cited by examiner

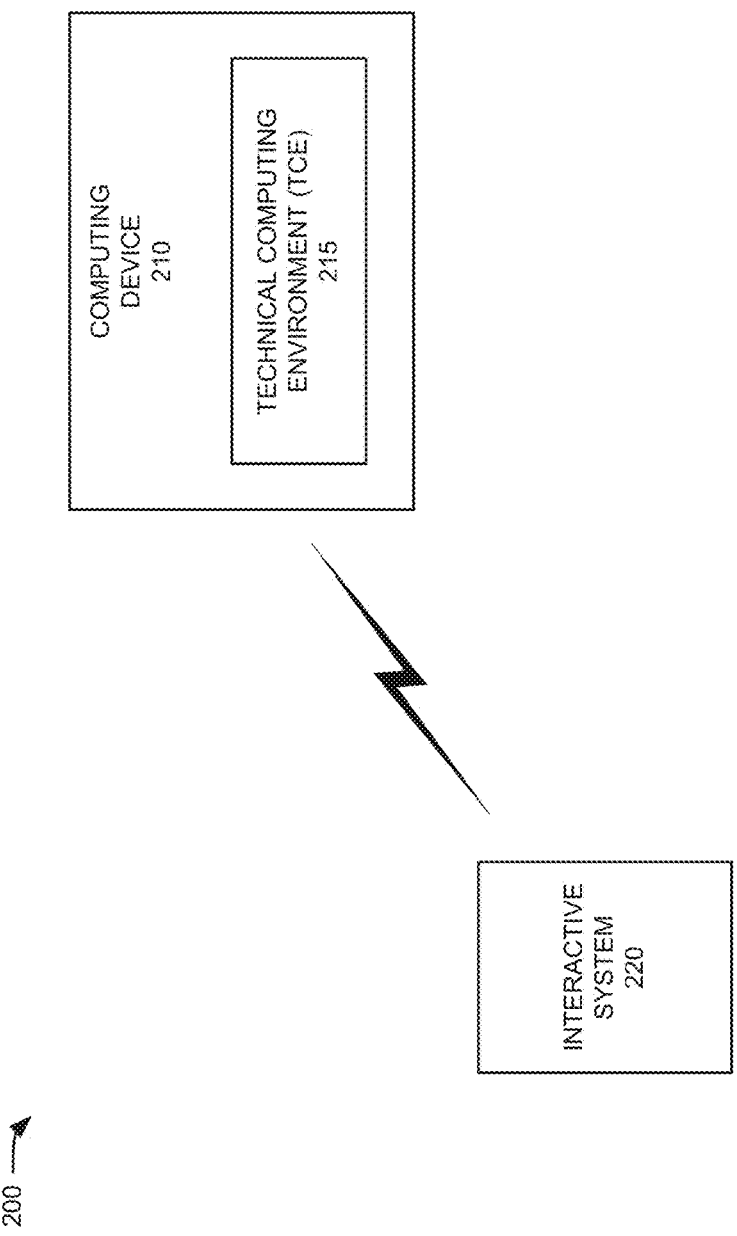

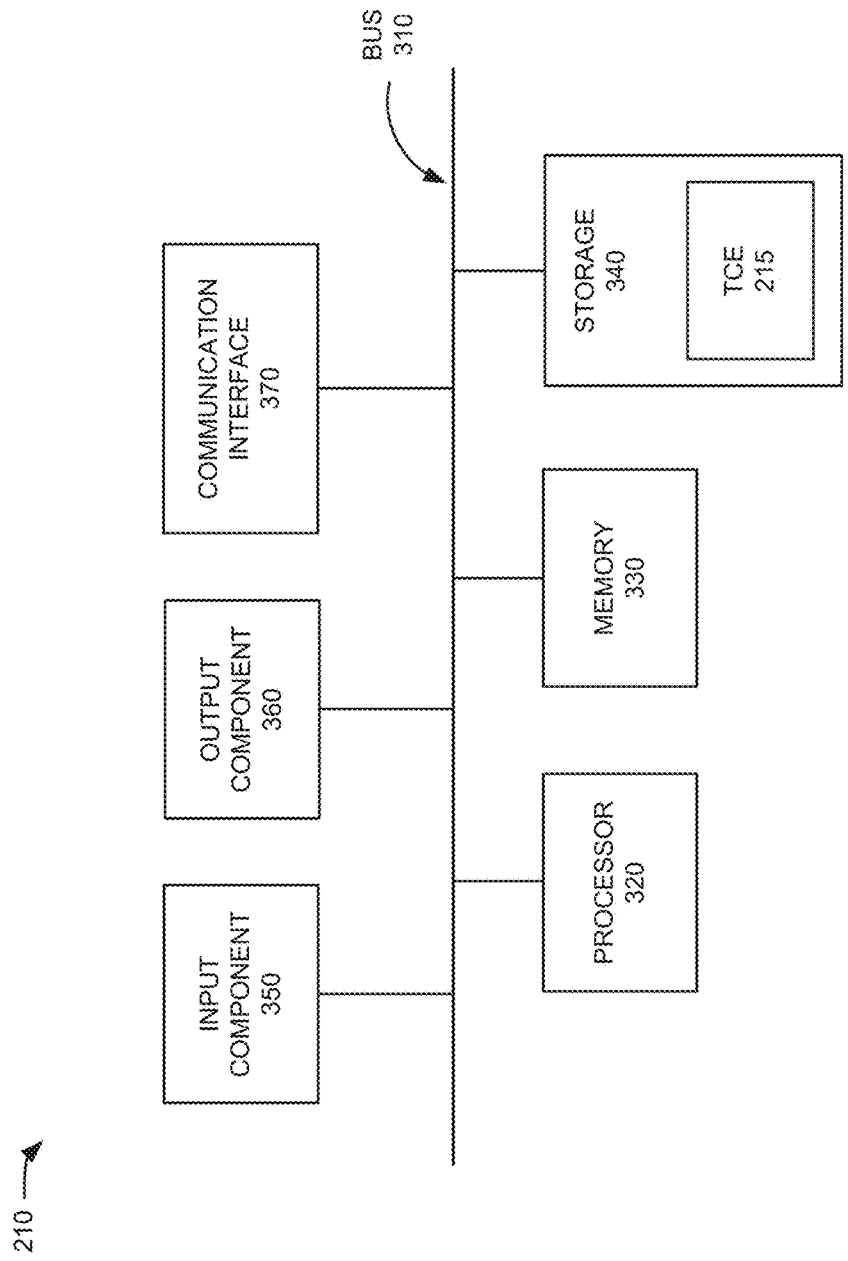

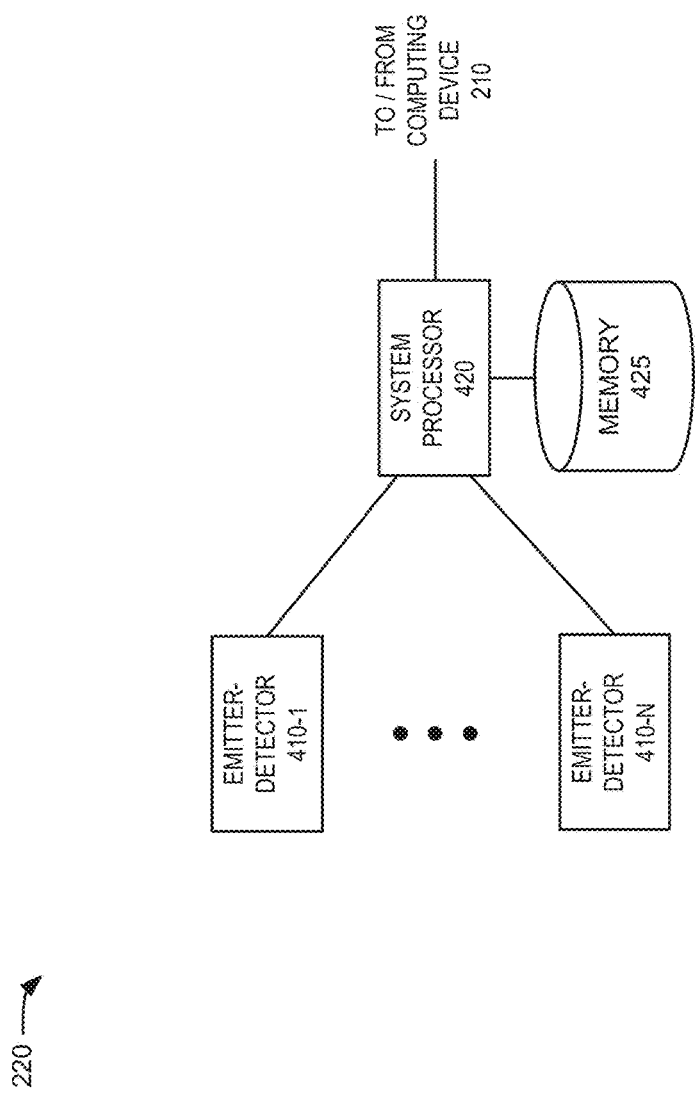

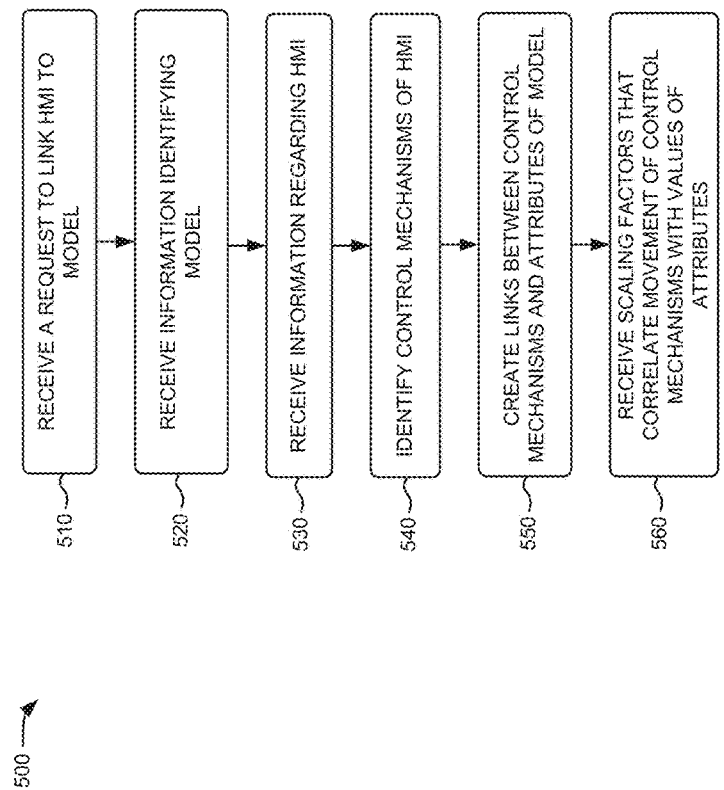

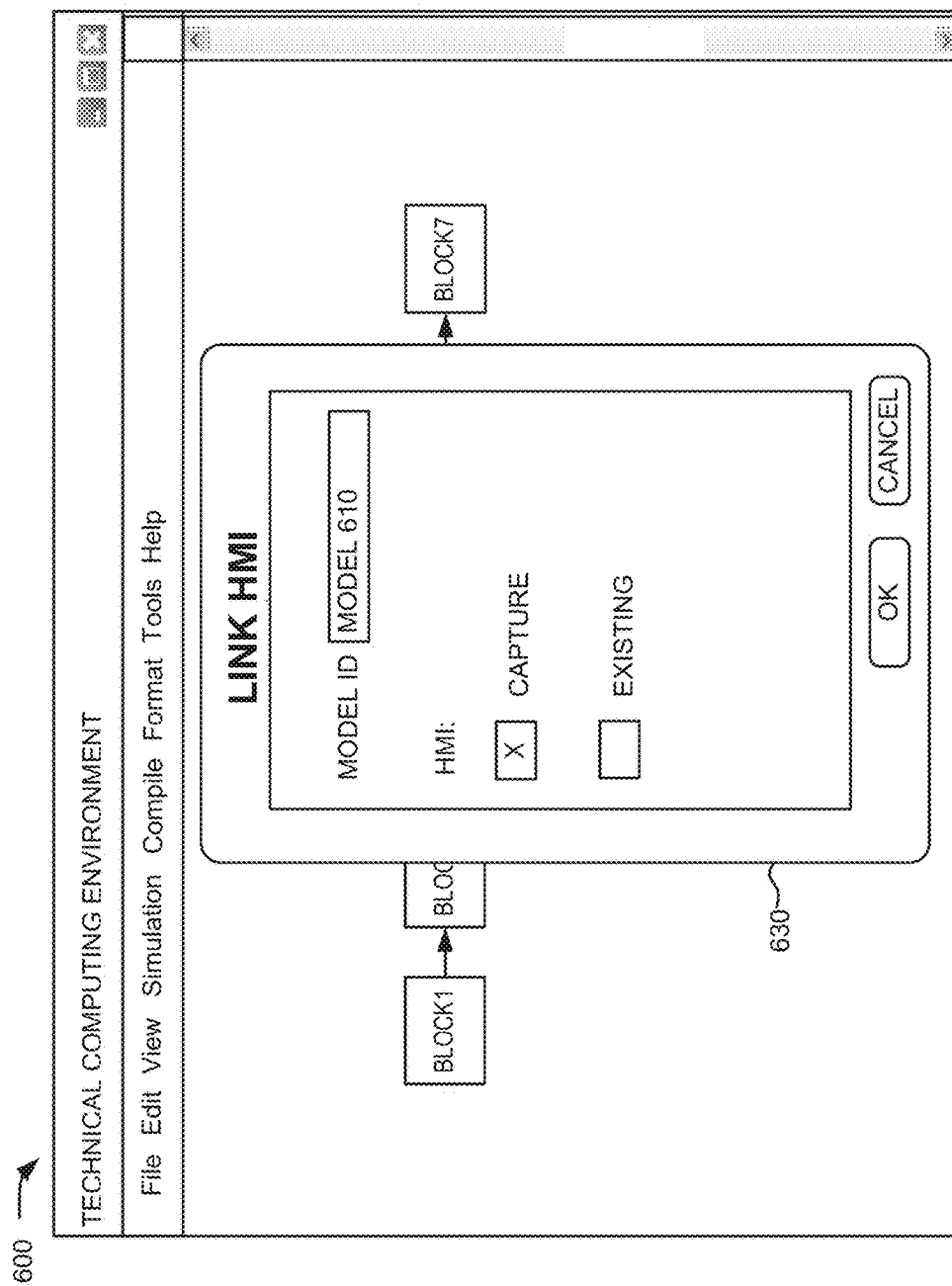

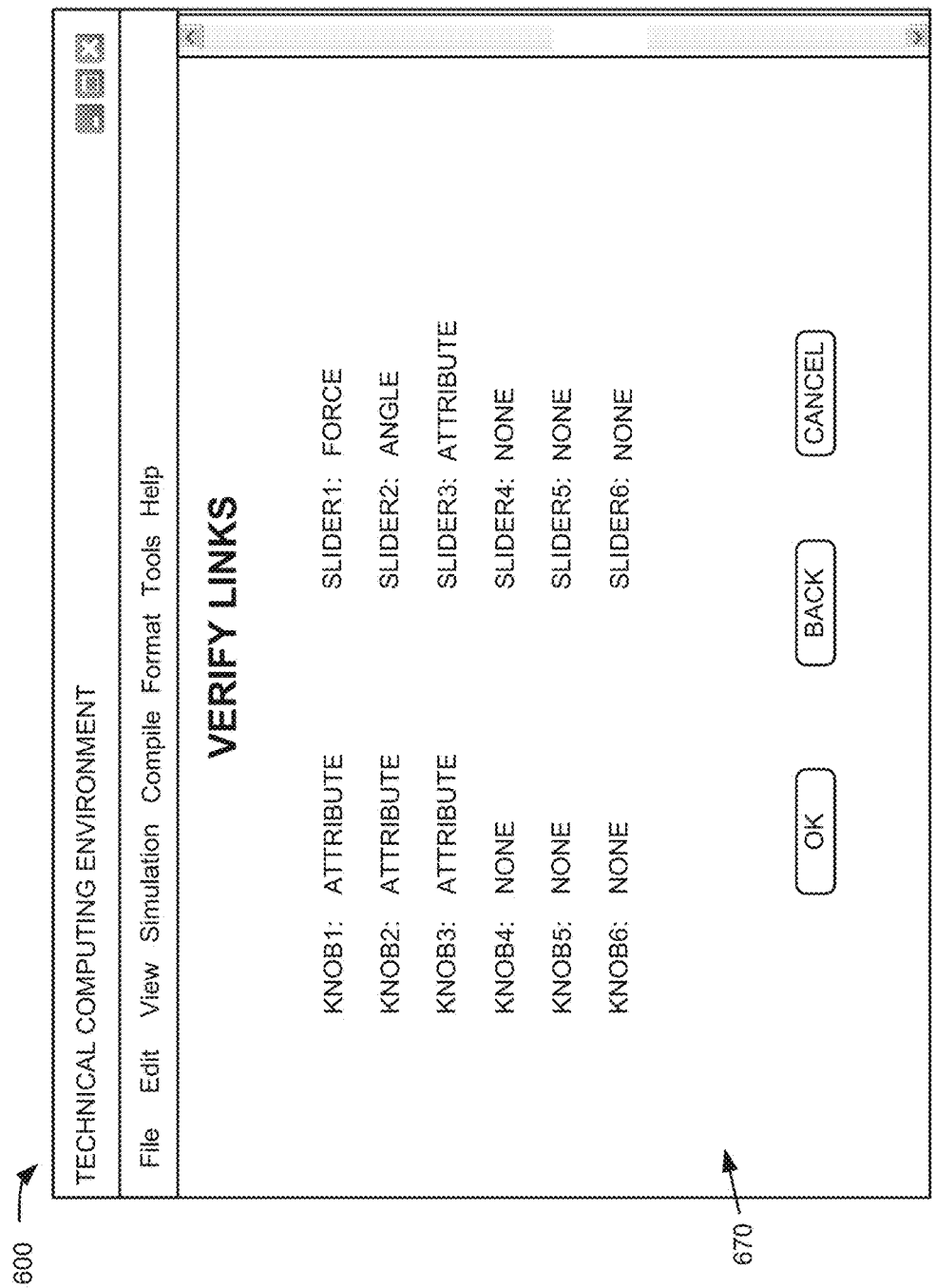

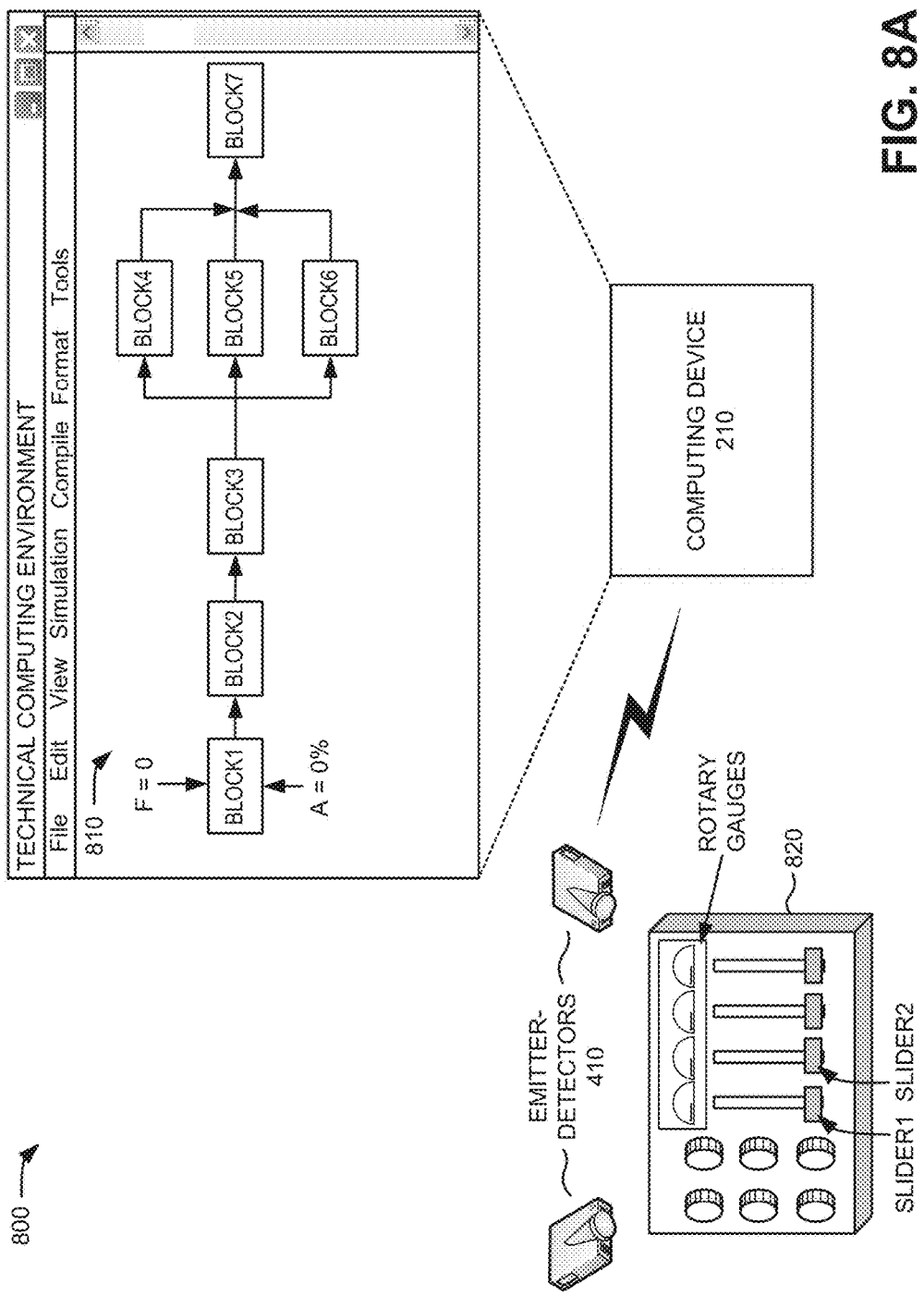

GENERIC HUMAN MACHINE INTERFACE FOR A GRAPHICAL MODEL

REFERENCE TO RELATED APPLICATION

This application is a Continuation-in-Part of U.S. patent application Ser. No. 13/533,841, filed Jun. 26, 2012, U.S. Pat. No. 9,117,039, the entire content of which is incorporated herein by reference.

BRIEF DESCRIPTION OF THE DRAWINGS

FIG. 2 is a diagram of an example environment in which systems and/or methods, described herein, may be implemented;

FIG. 3 is a diagram of example components of the computing device of FIG. 2;

FIG. 4 is a diagram of example components of the interactive system of FIG. 2;

FIG. 5 is a flowchart of an example process for creating links between attributes of a model and control mechanisms of a human machine interface (HMI);

FIGS. 6A-6F are an example of the process described in connection with FIG. 5;

FIGS. 8A and 8B are an example of the process described in connection with FIG. 7.

DETAILED DESCRIPTION

Figure 1:
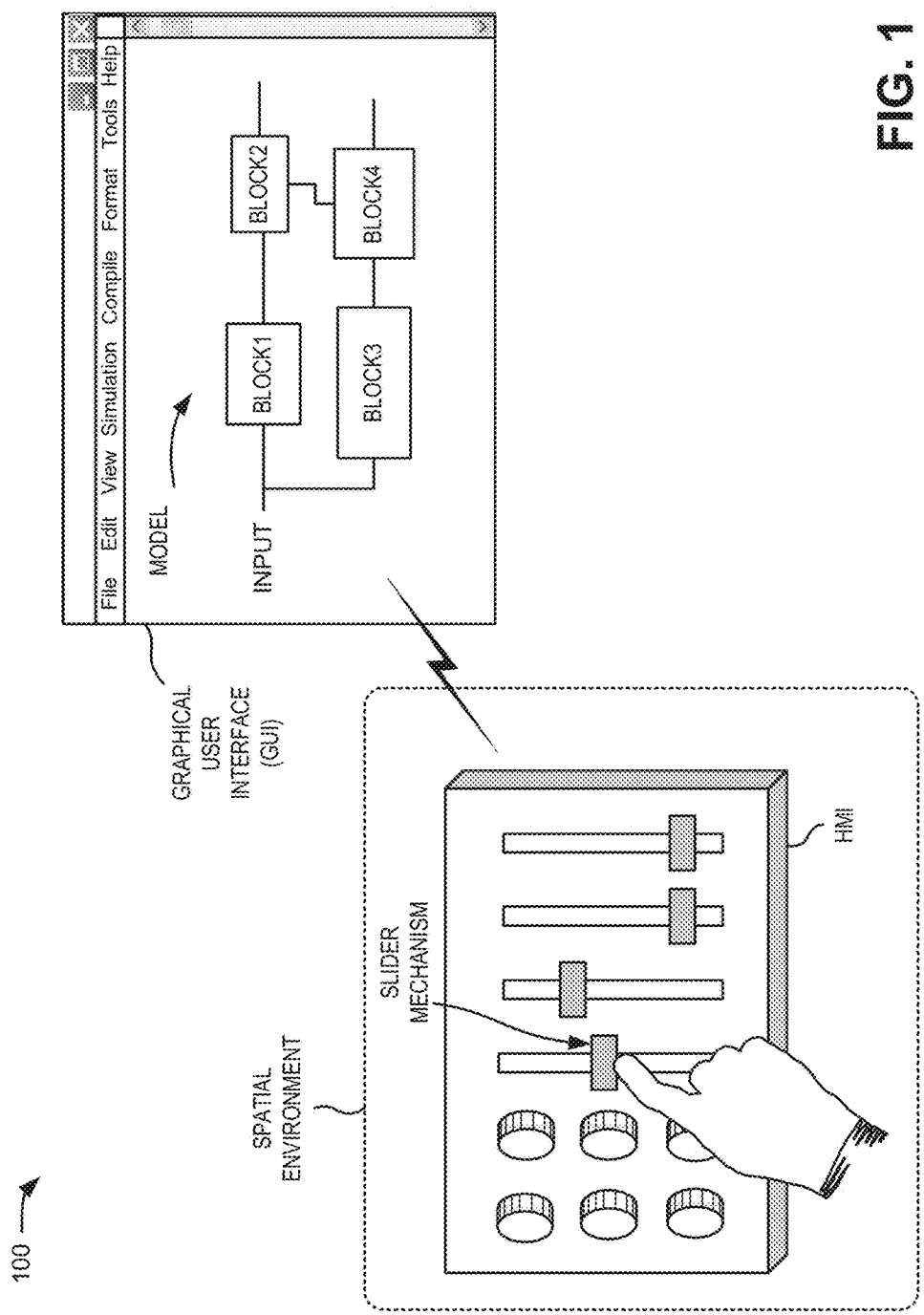
FIG. 1 is a diagram of an example overview of an implementation described herein.

The following detailed description of example embodiments refers to the accompanying drawings. The same reference numbers in different drawings may identify the same or similar elements.

A model may include a set of model elements that, when executed on a computing device, simulates behavior of a system, such as a dynamic system (e.g., an airplane wing/aileron system); a natural system (e.g., human organ, a plant, etc.), a physical system (e.g., a bouncing ball, etc.), etc. The system may include a set of physical elements that correspond to portions and/or components of the system. The model elements may correspond to physical elements and may, when executed, simulate the behavior of the physical elements and/or the system. The description below is described in the context of a dynamic system for explanatory purposes only. Systems and/or methods, described herein, may also be applied to static systems.

Systems and/or methods, described herein, may enable a computing device to create a link between an attribute of a model element, in a model, and a control mechanism of an HMI in a spatial environment. Once the link is created, a user's interaction with the control mechanism, in the spatial environment, may be monitored. Any changes to the control mechanism may cause a value of the attribute of the model element to be adjusted. By observing the user's interaction with the HMI in the spatial environment, a generic HMI may be used, in place of expensive and custom-made HMIs. In fact, virtually any type of electronic or non-electronic object may be used for the HMI. Interacting with the model, via the HMI in the spatial environment, may improve a user experience when using the model to run a simulation and/or improve a manner in which the model simulates behavior of the dynamic system.

As used herein, an HMI may broadly correspond to any type of physical object with which a user may interact, in a spatial environment, to adjust an attribute of a model. The HMI may include one or more control mechanisms, such as, for example, one or more rotating mechanisms, one or more sliding mechanisms, one or more switching mechanisms, one or more pushing mechanisms, and/or other types of mechanisms that may be manipulated via a user's hands and/or feet. In some implementations, the HMI may be a non-electronic physical object, such as a three dimensional (3D) printed object, or a portion of a user's body, such as a hand. In some implementations, the HMI may be an electronic device, such as a remote control, a cellular phone, a video game controller, etc. In some implementations, the HMI may include one or more output mechanisms, such as a digital readout, a rotary gauge, etc. that, for example, displays the values of an attribute, of the model, to which a control mechanism is linked.

Examples of an attribute of a model element may include a constant (e.g., a model attribute that has a value that cannot be changed during execution) or a parameter (e.g., a model attribute that may change at select points in time during execution, but that are not part of the state of the dynamic system). Another example, of an attribute of a model element may include a variable (e.g., a model attribute that is the state of the dynamic system or computed from the state of the dynamic system). One type of variable that is common in models is a source value (e.g., a model attribute that is an input variable to the model).

Systems and/or methods, as described herein, may use a computing environment, such as a technical computing environment (TCE), for performing computing operations. A TCE may include any hardware-based logic or a combination of hardware and software based logic that provides a computing environment that allows tasks to be performed (e.g., by users) related to disciplines, such as, but not limited to, mathematics, science, engineering, medicine, and business. The TCE may include text-based environments (e.g., MATLAB® software), a graphically-based environment (e.g., Simulink® software, Stateflow® software, SimEvents® software, Simscape™ software, etc., by The MathWorks, Incorporated; VisSim by Visual Solutions; LabView® by National Instruments; etc.), or another type of environment, such as a hybrid environment that may include, for example, one or more of the above-referenced text-based environments and one or more of the above-referenced graphically-based environments.

The TCE may be integrated with or operate in conjunction with a graphical modeling environment, which may provide graphical tools for constructing models of systems and/or processes. The TCE may include additional tools, such as tools designed to convert a model into an alternate representation, such as source computer code, compiled computer code, or a hardware description (e.g., a description of a circuit layout). This alternate representation may also include a link to a tag that is associated with the model element. The tag, thus, may enable the TCE to navigate to the model element and/or to one or more hierarchical levels of a model in which the model element exists. Additionally, or alternatively, the tag may enable the TCE to navigate to an element, in the alternative representation, that includes the link to the tag. Additionally, or alternatively, the tag may enable the TCE to navigate to one or more hierarchical levels, of the alternate representation, in which the element exists. In some implementations, the TCE may provide this ability using graphical toolboxes (e.g., toolboxes for signal processing, image processing, color manipulation, data plotting, parallel processing, etc.). In some implementations, the TCE may provide these functions as block sets. In some implementations, the TCE may provide these functions in another way.

Models generated with the TCE may be, for example, models of a physical system, a computing system, an engineered system, an embedded system, a biological system, a chemical system, etc. The models may be based on differential equations, partial differential equations, difference equations, differential and algebraic equations, discrete-event systems, state transition systems, state charts, data-flow systems, etc. In some implementations, models may be hierarchical, and include a number of hierarchical levels. A hierarchical level, of a hierarchical model, may be represented by an entity, such as a subsystem or a subchart. The subsystem or subchart may be associated with a local namespace, where data may be globally accessible within the namespace, but not outside the namespace.

A model generated with the TCE may include, for example, any equations, action language, assignments, constraints, computations, algorithms, functions, methods, and/or process flows. The model may be implemented as, for example, time-based block diagrams (e.g., via the Simulink® product, available from The MathWorks, Incorporated), discrete-event based diagrams (e.g., via the SimEvents® product, available from The MathWorks, Incorporated), dataflow diagrams, state transition diagram (e.g., via the Stateflow® product, available from The MathWorks, Incorporated), software diagrams, a textual array-based and/or dynamically typed language (e.g., via the MATLAB® product, available from The MathWorks, Incorporated), noncausal block diagrams (e.g., via the Simscape™ product, available from The MathWorks, Incorporated), and/or any other type of model.

The values of attributes of a model generated with the TCE may be set to characteristics settings, such as one or more default settings, one or more inherited settings, etc. For example, the data type of a variable that is associated with a block may be set to a default data type, such as a double. Because of the default setting, an alternate data type (e.g., a single, an integer, a fixed point, etc.) may be inferred based on attributes of elements that the model includes (e.g., the data type of a variable associated with a connected block) and/or attributes of the graphical model. As another example, the causality of an equation (i.e., which variable in the equation is computed by using that equation) associated with a block may be inferred based on attributes of elements that the model includes (e.g., the fixed causality of source elements in the model, the preferred causality of integration over time, etc.).

As yet another example, the sample time associated with a block may be set to be inherited. In case of an inherited sample time, a specific sample time may be inferred based on attributes of elements that the graphical model includes and/or attributes of the graphical model (e.g., a fundamental execution period). This inference may be performed by propagation of model element attributes. For example, after evaluating the sample time attribute of a first block, a graph search may proceed by evaluating the sample time attribute of a second block that is directly connected to the first block. The evaluating of the sample time attribute of the second block may account for the sample time attribute value of the first block (e.g., by adopting the value of the sample time attribute of the first block). Other attributes may also be inferred, such as dimension attributes and complexity attributes (e.g., whether a variable has an imaginary part).

As previously mentioned, an example embodiment of the TCE may use one or more text-based products, such as textual modeling environments. For example, a text-based modeling environment, may be implemented using products such as, but not limited to, MATLAB by The MathWorks, Incorporated; Octave, Python, Comsol Script, and MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim. In some embodiments, the text-based modeling environment may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In some implementations, the text-based modeling environment may include a dynamically typed language that may be used to express problems and/or solutions in mathematical notations familiar to those of skill in the relevant arts. For example, the modeling environment may use an array as a basic element, where the array may not require dimensioning. These arrays may be used to support array programming in that operations can apply to an entire set of values, such as values in an array. Array programming may allow array-based operations to be treated as a high-level programming technique or model that lets a programmer think and operate on entire aggregations of data without having to resort to explicit loops of individual non-array, i.e., scalar operations.

The modeling environment may further be adapted to perform matrix and/or vector formulations that may be used for data analysis, data visualization, application development, simulation, modeling, algorithm development, etc. These matrix and/or vector formulations may be used in many areas, such as statistics, finance, image processing, signal processing, control design, computer aided design (CAD), product life cycle management (PLM), life sciences, education, discrete event analysis and/or design, state based analysis and/or design, etc.

In another example embodiment, the TCE may be implemented in a graphically-based modeling environment using products such as, but not limited to, Simulink®, Stateflow®, SimEvents®, Simscape™, etc., by The MathWorks, Incorporated; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic; Ptolemy from the University of California at Berkeley; or aspects of a Unified Modeling Language (UML) or SysML environment.

FIG. 1 is a diagram illustrating an overview 100 of an example implementation described herein. With reference to FIG. 1, assume a user, of a computing device, has created, in a TCE and on a graphical user interface, a model that includes a number of interconnected model elements, shown as BLOCK1, BLOCK2, BLOCK3, and BLOCK4. The user may use the computing device to create a link between an attribute of a model element, in the model, and a control mechanism of an HMI that is located in a spatial environment. As shown in FIG. 1, assume that the user has created a link between a slider mechanism, of the HMI, and the input to model elements BLOCK1 and BLOCK3. Once the link has been created, the spatial environment may detect the user's interaction with the slider mechanism and may convey this interaction to the computing device. The computing device may adjust a value of the input based on the interaction.

FIG. 2 is a diagram of an example environment 200 in which systems and/or methods, described herein, may be implemented. As illustrated, environment 200 may include a computing device 210 and an interactive system 220.

Computing device 210 may include one or more devices capable of creating and/or executing a model. For example, computing device 210 may include a server, a workstation, a mainframe, a computer (e.g., a desktop computer, a laptop computer, a tablet computer, etc.), and/or some other type of computational device. Computing device 210 may generate, compile, and/or execute code.

Computing device 210 may host a TCE 215. TCE 215 may include hardware-based logic or a combination of hardware and software-based logic that provides a computing environment. TCE 215 may permit a user to perform tasks related to a discipline or a domain. For example, TCE 215 may pertain to mathematics, science, engineering, medicine, business, and/or another type of discipline or domain in a manner similar to that described above. In some implementations, TCE 215 may be hosted by another device, such as a server, that is located remotely from computing device 210.

Interactive system 220 may provide a spatial environment capable of communicating with computing device 210. Interactive system 220 may, for example, include one or more cameras, video cameras, infrared cameras, sonar, radar, depth sensors, microphones, multi-array microphones, lasers, photo detectors, radio frequency (RF) transmitters and/or receivers, electromagnetic field detectors, etc. Interactive system 220 may provide the spatial environment by monitoring a 3D volume of space. Interactive system 220 may, based on monitoring the 3D volume of space, obtain information (e.g., images, video, audio, RF signatures, optical signatures, electromagnetic field signatures, etc.) associated with an HMI and/or a user that is detected within the spatial environment.

Although FIG. 2 shows example components of environment 200, in some implementations, environment 200 may include additional components, different components, or differently arranged components than those depicted in FIG. 2. Additionally, or alternatively, one or more components of environment 200 may perform one or more tasks described as being performed by one or more other components of environment 200.

FIG. 3 is a diagram of example components of computing device 210. As shown in FIG. 3, computing device 210 may include a bus 310, a processor 320, a memory 330, storage 340, an input component 350, an output component 360, and/or a communication interface 370.

Bus 310 may permit communication among the other components of computing device 210. For example, bus 310 may include a system bus, an address bus, a data bus, and/or a control bus. Bus 310 may also include bus drivers, bus arbiters, bus interfaces, and/or clocks.

Processor 320 may interpret and/or execute instructions. For example, processor 320 may include a general-purpose processor, a microprocessor, a data processor, a graphics processing unit (GPU), a processing core, an application specific integrated circuit (ASIC), an application specific instruction-set processor (ASIP), a system-on-chip (SOC), a programmable logic device (PLD), a chipset, and/or a field programmable gate array (FPGA).

Memory 330 may store data and/or instructions related to the operation and use of computing device 210. For example, memory 330 may store data and/or instructions that may be configured to implement an implementation described herein. Memory 330 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage 340 may store data and/or software related to the operation and use of computing device 210. For example, storage 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive. Memory 330 and/or storage 340 may also include a storage device external to and/or removable from computing device 210, such as a Universal Serial Bus (USB) memory stick, a hard disk, etc. In an implementation, as illustrated, storage 340 may store TCE 215.

Input component 350 may permit the user and/or another device to input information into computing device 210. For example, input component 350 may include a keyboard, a keypad, a mouse, a display (e.g., a touch screen), a touchpad, a button, a switch, a microphone, a camera, an accelerometer, a gyroscope, neural interface logic, voice recognition logic, an input port, and/or some other type of input component. Output component 360 may permit computing device 210 to output information to the user and/or another device. For example, output component 360 may include a display, a speaker, a light emitting diode (LED), a haptic device, a tactile device, an output port, and/or some other type of output component.

Communication interface 370 may permit computing device 210 to communicate with other devices and/or systems via one or more networks. Communication interface 370 may include a transceiver-like component. For example, communication interface 370 may include an Ethernet interface, an optical interface, a coaxial interface, a radio interface, and/or some other type of wireless and/or wired interface.

As will be described in detail below, computing device 210 may perform certain operations relating to implementations described herein. Computing device 210 may perform these operations in response to processor 320 executing software instructions (e.g., computer program(s)) contained in a computer-readable medium, such as memory 330 and/or storage 340. A computer-readable medium may be defined as a non-transitory memory device. A memory device may include space within a single physical memory device or spread across multiple physical memory devices. The software instructions may be read into memory 330 from another computer-readable medium, such as storage 340, or from another device via communication interface 370. The software instructions contained in memory 330 may cause processor 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of computing device 210, in some implementations, computing device 210 may include additional components, fewer components, different components, or differently arranged components than those depicted in FIG. 3. Additionally, or alternatively, one or more components of computing device 210 may perform one or more tasks described as being performed by one or more other components of computing device 210.

FIG. 4 is a diagram of example components of interactive system 220. As shown, interactive system 220 may include a group of emitter-detectors 410-1, . . . , 410-N (where N≥1) (hereinafter referred to collectively as "emitter-detectors 410" and individually as "emitter-detector 410"), a system processor 420, and a memory 425.

Emitter-detector 410 may include one or more devices that obtain information associated with a physical object (e.g., an HMI) or a user located within and/or interacting with a 3D volume of space that corresponds to a spatial environment. For example, emitter-detector 410 may include a camera, a RF transmitter, a RF receiver, a speaker, a microphone, a multi-array microphone, a laser, a sonar, a radar, an infrared camera, a depth sensor, a photodetector, a magnetic and/or electromagnetic component, etc. Emitter-detector 410 may, for example, include a camera to record images and/or video (e.g., based on frequencies that correspond to visible light, infrared, ultraviolet, etc.) of all or a portion of a physical object (e.g., an HMI) and/or a user (e.g., the user's hands, fingers, head, eyes, body, etc.) within the spatial environment. Emitter-detector 410 may provide the video to system processor 420 to be processed. Additionally, or alternatively, emitter-detector 410 may include a transmitter that transmits a signal (e.g., a RF transmitter to transmit a RF signal, a speaker to transmit an acoustic signal, etc.) into the spatial environment. Emitter-detector 410 may include a receiver (e.g., a RF receiver, a microphone, etc.) to receive a signal that reflects off the physical object and/or the user located within the spatial environment (e.g., a RF receiver to receive a reflected RF signal, a microphone to receive a reflected acoustic signal, etc.). The received signal may identify dimensions, surface contours, location, orientation, etc. of the physical object and/or the user within the spatial environment. Emitter-detector 410 may convert the received signal to an electrical signal and/or a format that can be processed by system processor 420.

Emitter-detector 410 may also, or alternatively, include a laser that transmits an optical signal that scans the spatial environment. Emitter-detector 410 may also, or alternatively, include a photodiode and/or some other component that receives a reflected optical signal from the physical object and/or the user that is located within the spatial environment. The reflected signal may identify dimensions, surface contours, location, orientation, etc. associated with the physical object and/or the user within the spatial environment. Emitter-detector 410 may convert the reflected optical signal to an electrical signal and/or to a format that can be received and/or processed by system processor 420.

In some implementations, emitter-detector 410 may be implemented as two or more separate devices. In one example, emitter functions (e.g., that enable information and/or signals to be transmitted to the spatial environment) may be implemented in a separate device from detector functions (e.g., that receive transmitted and/or reflected information and/or signals from the spatial environment).

For example, a first emitter-detector 410, that performs emitter functions, may transmit a signal (e.g., a RF signal, an acoustic signal, an optical signal, etc.) into the spatial environment and a second emitter-detector 410, that performs detector functions, may receive the transmitted signal and/or a reflected signal that reflects off of the physical object and/or the user located within the spatial environment. The first emitter-detector 410 and the second emitter-detector 410 may be mono-static with respect to the spatial environment (e.g., associated with approximately the same viewing angle with respect to the spatial environment) or may be bi-static or multi-static with respect to the spatial environment (e.g., associated with different viewing angles with respect to the spatial environment).

System processor 420 may include one or more processors that interpret and/or execute instructions. For example, system processor 420 may include a general-purpose processor, a microprocessor, a data processor, a GPU, a processing core, an ASIC, an ASIP, a SOC, a PLD, a chipset, a FPGA, and/or another type of processor. System processor 420 may receive, from emitter-detector 410, video content and/or signals that include information associated with the physical object located within the spatial environment. System processor 420 may also, or alternatively, process the received information to create spatial information associated with the physical object. In one example, system processor 420 may receive information from two or more emitter-detectors 410 that obtain information, associated with the spatial environment, from two or more viewing angles. System processor 420 may use the information, obtained from the two or more viewing angles, to perform stereoscopic and/or holographic processing on received information to generate spatial information, associated with the physical object, based on three-spatial dimensions. In one example, the spatial information may represent a signature (e.g., a visual signature, an infrared signature, a RF signature, an acoustic signature, etc.) of the physical object (e.g., in two dimensions, three-dimensions, etc.).

System processor 420 may, for example, process the received information to identify the physical object based on dimensions (e.g., length, width, height, etc.), surface contours (e.g., boundaries, edges, curvatures, etc.), color, brightness, etc. associated with the physical object. System processor 420 may also, or alternatively, process the information to identify a location and/or an orientation, associated with the physical object, based on a three-dimensional coordinate system associated with the spatial environment. The location may be based on a coordinate system, associated with the spatial environment, such as, a Cartesian coordinate system (e.g., based on orthogonal x-axis, y-axis, z-axis), a cylindrical coordinate system (e.g., based on radial distance, height distance, and angular component), a spherical coordinate system (e.g., based on radial distance, azimuth angle, and polar angle), etc. The orientation may also, or alternatively, be represented by an amount of roll, pitch, and/or yaw of the physical object within the spatial environment. System processor 420 may also use the received information to identify particular gestures (e.g., hand gestures, etc.) and/or movements by a user and/or the physical object that represent instructions (e.g., select a spatial element, select a model element, execute a model, change an orientation, change an attribute associated with a model, change a value of an attribute associated with a model, etc.) to be interpreted by computing device 210. System processor 420 may also use the received information to determine a change in location and/or orientation, of the user and/or the physical object, as a function of time. System processor 420 may provide the processed information, as spatial information, to computing device 210.

Memory 425 may include one or more memory devices that store data and/or instructions related to the operation and use of interactive system 220. For example, memory 425 include a RAM, a DRAM, a SRAM, a SDRAM, a FRAM, a ROM, a PROM, an EPROM, an electrically erasable programmable read only memory EEPROM, a flash memory, and/or another type of memory. Memory 425 may also, or alternatively, store spatial information obtained and/or generated based on monitoring the spatial environment.

Although FIG. 4 shows example components of interactive system 220, in some implementations, interactive system 220 may include additional components, fewer components, different components, or differently arranged components than those depicted in FIG. 4. For example, in some implementations, system processor 420 and memory 425 may be located within computing device 210. Additionally, or alternatively, one or more components of interactive system 220 may perform one or more tasks described as being performed by one or more other components of interactive system 220.

FIG. 5 is a flowchart of an example process 500 for creating links between attributes of a model and control mechanisms of an HMI. In some implementations, process 500 may be performed by computing device 210. In some implementations, one or more blocks of process 500 may be performed by one or more devices instead of, or possibly in conjunction with, computing device 210.

Process 500 may include receiving a request to link an HMI and a model (block 510). For example, computing device 210 (e.g., TCE 215) may receive a request, from a user of computing device 210, to link an HMI with a model. In some implementations, computing device 210 may receive the request based on detecting a selection of a particular menu item, entry of a particular textual or audible input from the user, and/or entry of some other predetermined input that identifies a desire to link an HMI and a model.

Process 500 may include receiving information identifying a model (block 520). For example, computing device 210 (e.g., TCE 215) may provide a user interface, to the user, that allows the user to specify a model that will be linked to an HMI. In some implementations, the user interface may be provided as a separate window, such as a popup window. In some implementations, the user may provide information, to the user interface, identifying the model, such as a name of the model. In some implementations, the user may specify the model based on the user selecting the model in TCE 215 (e.g., by selecting the model in a list of available models). In these implementations, the user interface may automatically be populated with information identifying the model that was selected in TCE 215. Computing device 210 may identify the model in other ways, including ways that do not include a user interface.

Process 500 may include receiving information identifying an HMI (block 530). For example, computing device 210 (e.g., TCE 215) may provide a user interface, to the user, that allows the user to specify an HMI that will be linked to the identified model. For example, the HMI may have been previously used to control attributes of the model or attributes of a different model. In these situations, the user may identify the HMI by providing, for example, a name of the HMI or other information identifying the HMI. In some implementations, the user interface, via which the user may identify the HMI, may be provided as a separate window, such as a popup window. In some implementations, the user interface may allow the user to specify a manner in which the HMI will be identified. For example, computing device 210 may allow the user to identify the HMI via interactive system 220 or in another manner.

With respect to interactive system 220, the user may bring the HMI into the spatial environment monitored by interactive system 220. In some implementations, the HMI may include a group of control mechanisms. Interactive system 220 may detect the presence of the HMI in the spatial environment. In some implementations, the HMI may be affixed with a bar code or another type of identifying information. In these implementations, interactive system 220 may read the bar code or other identifying information. In any event, interactive system 220 may provide information identifying the HMI to computing device 210. The information may include textual information, descriptive information, and/or visual information relating to the HMI. Computing device 210 may cause some or all of the received information to populate the user interface.

In some implementations, interactive system 220 may provide a virtual representation of an HMI in the spatial environment. For example, interactive system 220 may provide a holographic representation of an HMI in the spatial environment. The user may identify the holographic representation or a portion of the holographic representation as the HMI.

In some implementations, the user may cause computing device 210 to generate a virtual representation of an HMI in the spatial environment (e.g., via stereoscopic projection). For example, the user may identify, in TCE 215, a number of attributes, of the model, that are to be controlled by the HMI. Computing device 210 may automatically generate a virtual representation of an HMI, in the spatial environment, based on the identified model attributes.

In some implementations, the user may cause computing device 210 to generate a physical representation of an HMI (e.g., via 3D printing). For example, the user may identify, in TCE 215, a number of attributes, of the model, that are to be controlled by the HMI. Computing device 210 may automatically generate a physical representation of an HMI based on the identified model attributes.

As an alternative to identifying the HMI using interactive system 220, the user may upload an image of the HMI. For example, assume that the user desires to link the model to an HMI that includes two rows of knobs. The user may upload an image of the HMI to computing device 210. Computing device 210 may populate the user information with information relating to the image. Computing device may identify the HMI in other ways.

Process 500 may include identifying control mechanisms of the HMI (block 540). For example, computing device 210 (e.g., TCE 215) may identify the control mechanisms that are included on the HMI. In some implementations, computing device 210 may provide a user interface, to the user, that allows the user to identify the control mechanisms. For example, the user interface may provide a visual representation of the HMI and the user may select portions of the HMI that correspond to control mechanisms. In some implementations, the user interface may be provided as a separate window, such as a popup window. In those implementations where the HMI was previously used in connection with the model or a different model, computing device 210 may identify the control mechanisms on the HMI based on a previous analysis of the HMI.

In some implementations, interactive system 220 may analyze the HMI and detect the control mechanisms included on the HMI. For example, interactive system 220 may identify rotating mechanisms, sliding mechanisms, pushing mechanisms, switching elements, etc. on the HMI. In some implementations, interactive system 220 may identify the control mechanisms based on input from the user. For example, interactive system 220 may identify control mechanisms based on the user pointing to the control mechanism while the HMI is in the spatial environment. Interactive system 220 may send information, relating to the identified control mechanisms, to computing device 210. Computing device 210 may identify the control mechanisms included on the HMI in other ways.

In some implementations, computing device 210 may receive information relating to the identified control mechanisms. For example, computing device 210 may receive information that identifies a range of motion of each control mechanism. In some implementations, computing device 210 may receive this information from interactive system 220. For example, the user may, while in the spatial environment, manipulate a control mechanism across its range of motion (e.g., turn a knob through a full range of motion, push a button, slide a slider through a full range of motion, etc.). Interactive system 220 may capture this information and provide the information to computing device 210 to allow computing system 210 to identify the degree of freedom that is available for each control mechanism.

Process 500 may include creating links between the control mechanisms and attributes of the model (block 550). For example, computing device 210 (e.g., TCE 215) may provide a user interface, to the user, that allows the user to specify which control mechanisms will control which attributes of the model. As one example, assume that a particular model element, of the model, has an input that corresponds to a velocity of a particular system to which the model relates. The user may specify that a particular rotating mechanism, of the HMI, will be linked to the velocity input. Thus, by rotating the rotating mechanism, while the HMI is in the spatial environment, the user may increase or decrease the value of the velocity input.

In some implementations, computing device 210 may receive information linking the control mechanisms and attributes of the model from interactive system 220. For example, the user may point to a control mechanism, while the HMI is in the spatial environment, and may identify the attribute, of the model, to which the control mechanism is to be linked. The user may identify the attribute, to interactive system 220, verbally, via a hand gesture, or in another manner. Interactive system 220 may send the information linking the control mechanisms and the attributes to computing device 210.

In some implementations, computing device 210 may create links between attributes of the model and control mechanisms of the HMI without user input. For example, computing device 210 may automatically assign particular attributes of the model to control mechanisms of the HMI. In this situation, computing device 210 may provide information, to the user, that identifies which attribute is assigned to which control mechanism. Computing device 210 may allow the user to modify the assignments of attributes to control mechanisms. In some implementations, computing device 210 may create a link between a control mechanism and an attribute of the model in other ways.

Process 500 may include receiving scaling factors that correlate movement of control mechanisms with values of the attributes (block 560). For example, computing device 210 (e.g., TCE 215) may provide a user interface, to the user, that allows the user to specify, for each control mechanism, a scaling factor, which equates a quantity of movement of the control mechanism to a value or an adjustment of a value of the attribute to which the control mechanism is linked. In some implementations the scaling factor may be value dependent (e.g., as in a calibration table). In some implementations, the user interface may allow the user to specify that a particular position of the control mechanism equates to a particular value of the attribute.

As a first example, the user may specify, for a rotating mechanism, that when the rotating mechanism is rotated in a first direction, the value of the corresponding attribute will increase and when the rotating mechanism is rotated in an opposite direction, the value of the corresponding attribute will decrease. Moreover, the user may specify, for the rotating mechanism, that a rotation of a specified amount causes the value of the attribute to increase/decrease by a specified amount or by a specified factor. As one example, the user may specify that rotation of the rotating mechanism by 15 degrees in a clockwise direction causes the value of the attribute to increase by 10.

As a second example, the user may specify, for a sliding mechanism, that when the rotating mechanism is moved in a first direction, the value of the corresponding attribute will increase and when the sliding mechanism is moved in an opposite direction, the value of the corresponding attribute will decrease. Moreover, the user may specify, for the sliding mechanism, that a movement of a specified amount causes the value of the attribute to increase/decrease by a specified amount or by a specified factor. As one example, the user may specify that moving the sliding mechanism by one inch in a first direction causes the value of the attribute to increase by 10.

As a third example, the user may specify, for a pushing mechanism, that when the pushing mechanism is pushed a first quantity of times, the value of the corresponding attribute will increase and when the pushing mechanism is pushed a second quantity of times, the value of the corresponding attribute will decrease. As one example, the user may specify that pushing the pushing mechanism a single time causes the value of the attribute to increase by 10.

As a fourth example, the user may specify, for a switching mechanism, that when the switching mechanism is in a first position, the attribute will have a first value and when the switching mechanism is in an opposite position, the attribute will have a second value. As one example, the user may specify that the switching mechanism being in a first position, causes the attribute to have a value of 10 and that the switching mechanism being in an opposite position causes the attribute to have a value of 20.

In some implementations, computing device 210 may receive other information relating to the correlation of movement of the control mechanisms with the values of the attributes. For example, the user may provide, to computing device 210, the units of the values of the attributes (e.g., meters per second, decibels, hertz, etc.). In some implementations, computing device 210 may identify the units of the values of the attributes without user input. For example, computing device 210 may infer a unit of value of an attribute based on analyzing the model. In some implementations, the user may specify a unit of the value of an attribute and computing device 210 may infer the unit of the value of the attribute. In those situations where the user-specified unit and the computing device-specified unit conflicts, computing device 210 may, for example, request that the user resolve the conflict.

In some implementations, computing device 210 may receive information indicating whether the value of an attribute is to be displayed. In those situations where the HMI includes an output mechanism (e.g., a digital readout, a rotary gauge, etc.), computing device 210 may receive information that identifies that the value of a particular attribute, of the attributes linked to control mechanisms of the HMI, is to be displayed via the output mechanism. In those situations where the HMI does not include an output mechanism, computing device 210 may receive information that identifies that the value of a particular attribute is to be displayed and information identifying the location where the value of the particular attribute is to be displayed (e.g., via a display device associated with computing device 210 or a display device associated with interactive system 220). Thus, the value of an attribute may be displayed even in those situations where the HMI does not include an output mechanism.

Computing device 210 may store the scaling factors and the other information in connection with the information linking the control mechanisms and the attributes. Details relating to the use of the link are provided below with respect to FIG. 7.

While FIG. 5 shows process 500 as including a particular quantity and arrangement of blocks, in some implementations, process 500 may include fewer blocks, additional blocks, or a different arrangement of blocks. Additionally, or alternatively, some of the blocks may be performed in parallel.

FIGS. 6A-6F are an example 600 of process 500 described above with respect to FIG. 5. As shown in relation to FIG. 6A, computing device 210 may provide a TCE that includes a model 610. As shown, model 610 may include a group of blocks, identified as BLOCK1, BLOCK2, BLOCK3, BLOCK4, BLOCK5, BLOCK6, and BLOCK7. For example 600, assume that model 610 corresponds to a portion of an airplane and that BLOCK3 corresponds to an aileron. Assume further that BLOCK3 has an input corresponding to a force and that the user is interested in linking a control mechanism of an HMI to the force input to BLOCK3. The user may select a menu item 620, called LINK HMI, to link the HMI to model 610.

Upon detecting the selection of LINK HMI menu item 620, computing device 210 may provide a user interface 630, as shown in FIG. 6B. User interface 630 may, for example, allow the user to identify the model and the HMI. With respect to the model and based on model 610 being present in the TCE when menu item 620 was selected, user interface 630 may be pre-populated with information identifying the model (i.e., MODEL 610). Alternatively, the user may provide information identifying the model to user interface 630. With respect to the HMI and as shown in FIG. 6B, user interface 630 may allow the user to specify a manner by which the HMI will be identified. For example, user interface 630 may allow the user to choose to identify the HMI from the spatial environment or identify an existing HMI (e.g., an HMI that was previously linked to another model). Assume, for example 600, that the user has elected to provide the information identifying the spatial element from the spatial environment.

Figure 6A:
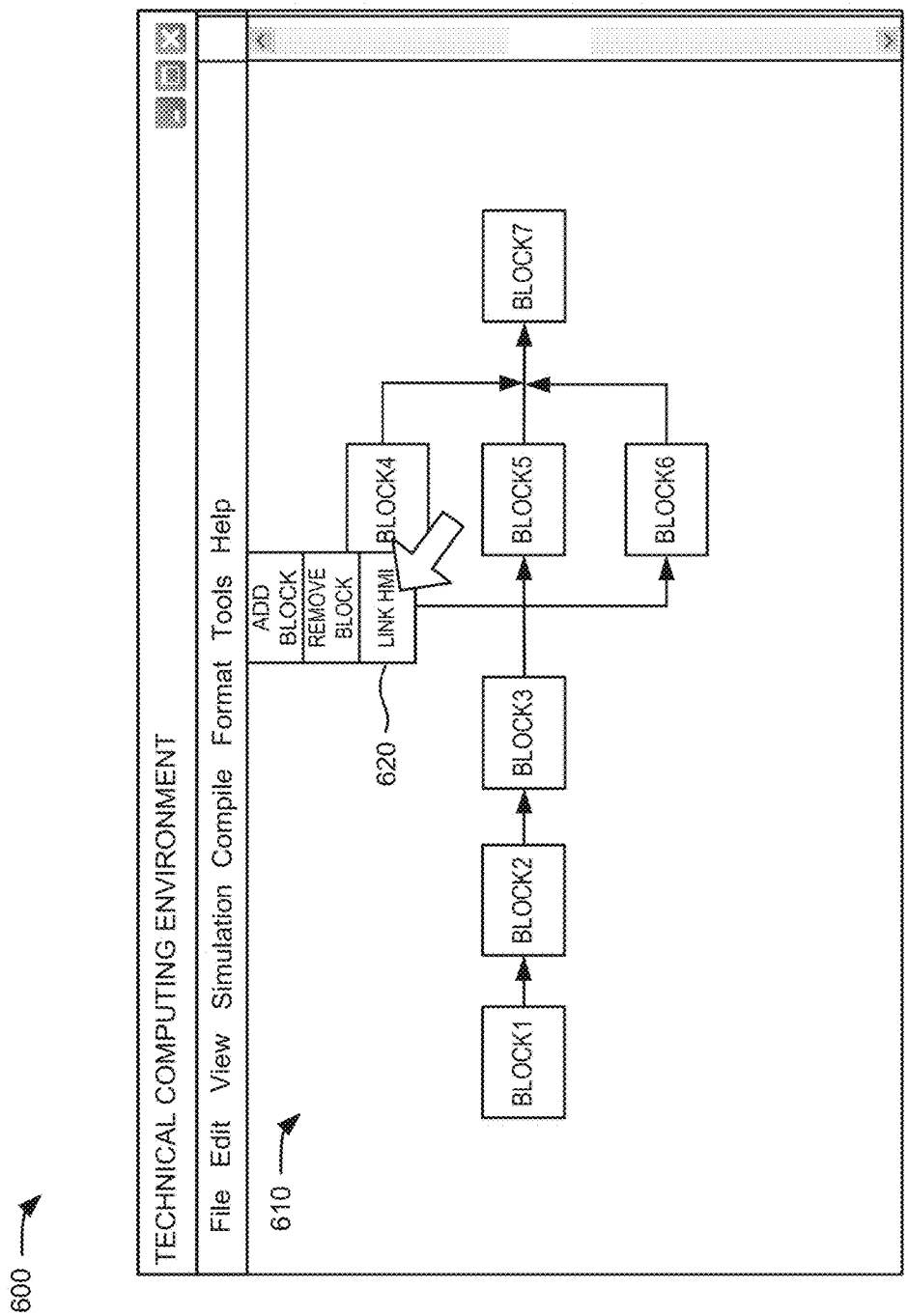
Figure 6C:
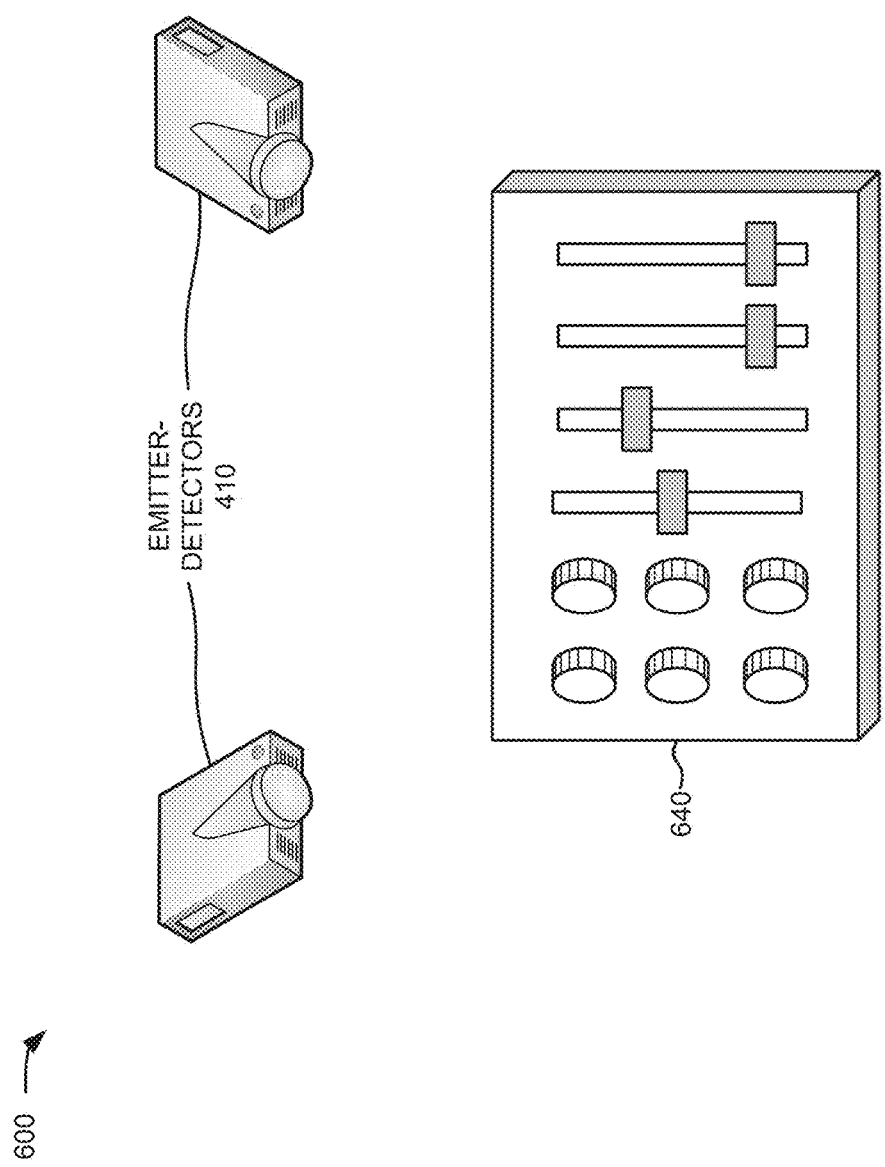

Upon selecting the OK button in user interface 630, computing device 210 may instruct the user to bring the HMI into the spatial environment being monitored by interactive system 220. With reference to FIG. 6C, assume that the user brings an HMI 640 into the spatial environment. Emitter-detectors 410 may detect the presence of HMI 640 and obtain information relating to HMI 640, such as an image of HMI 640 and information relating to the control mechanisms on HMI 640. Emitter-detectors 410 may obtain additional or other information relating to the HMI, as described above with respect to FIG. 4. Interactive system 220 may transmit the obtained information to computing device 210.

Figure 6D:
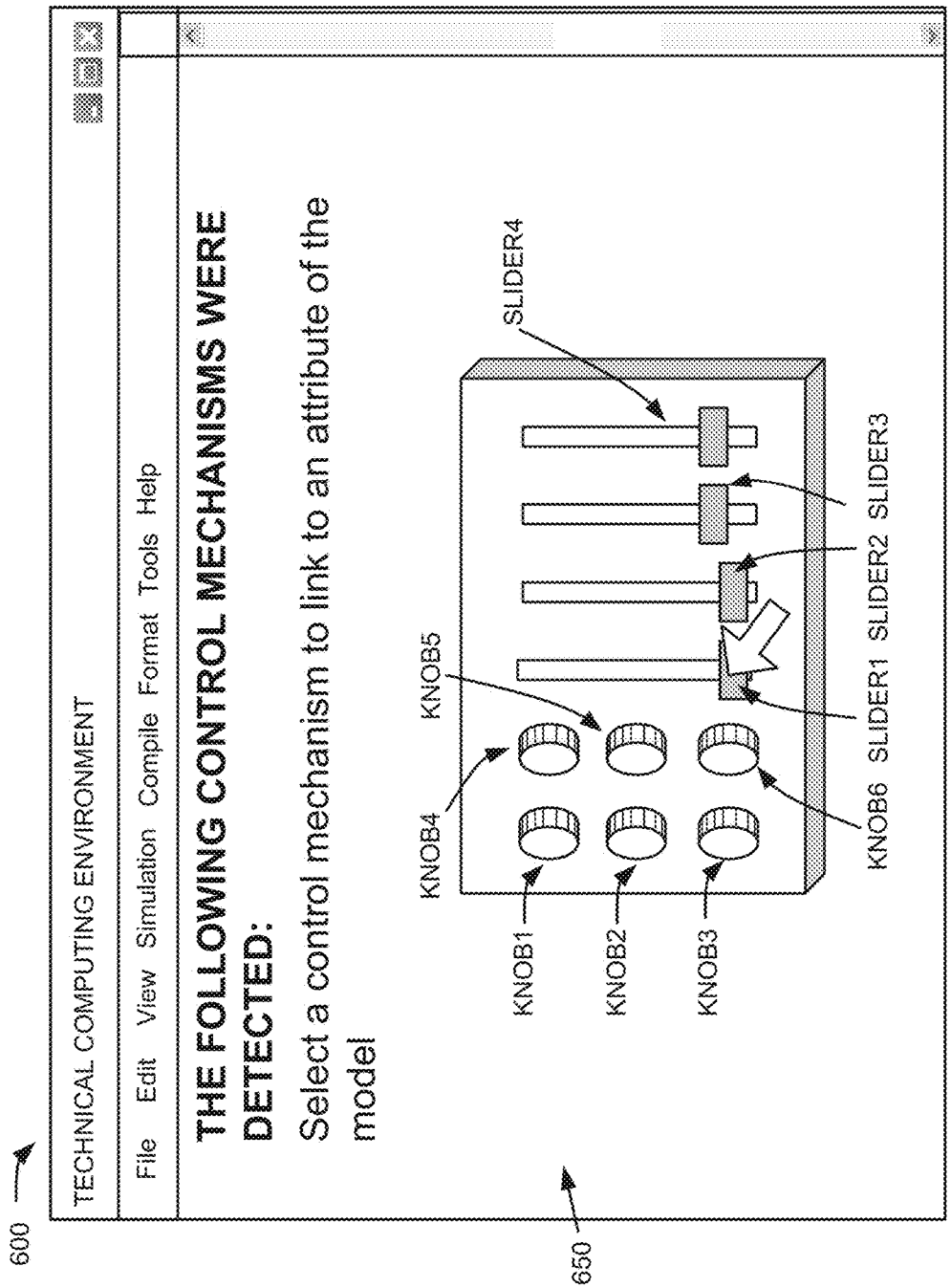

With reference to FIG. 6D, computing device 210 may cause a user interface 650 to be provided to the user based on an HMI being captured via interactive system 220 or based on the user identifying an existing HMI. User interface 650 may provide information relating to HMI 640. For example, user interface 650 may depict HMI 640 and identify, to the user, the control mechanisms included on HMI 640. As shown in FIG. 6D, user interface 650 indicates that HMI 640 includes 6 rotating mechanisms, identified as KNOB1-KNOB6, and 4 sliding mechanisms, identified as SLIDER1-SLIDER4. To assign an attribute to a control mechanism, the user may select the control mechanism in user interface 650. Assume for example 600 that the user wishes to assign the force input to BLOCK3 to control mechanism SLIDER1. Thus, the user may select control mechanism SLIDER1 in user interface 650.

Figure 6E:
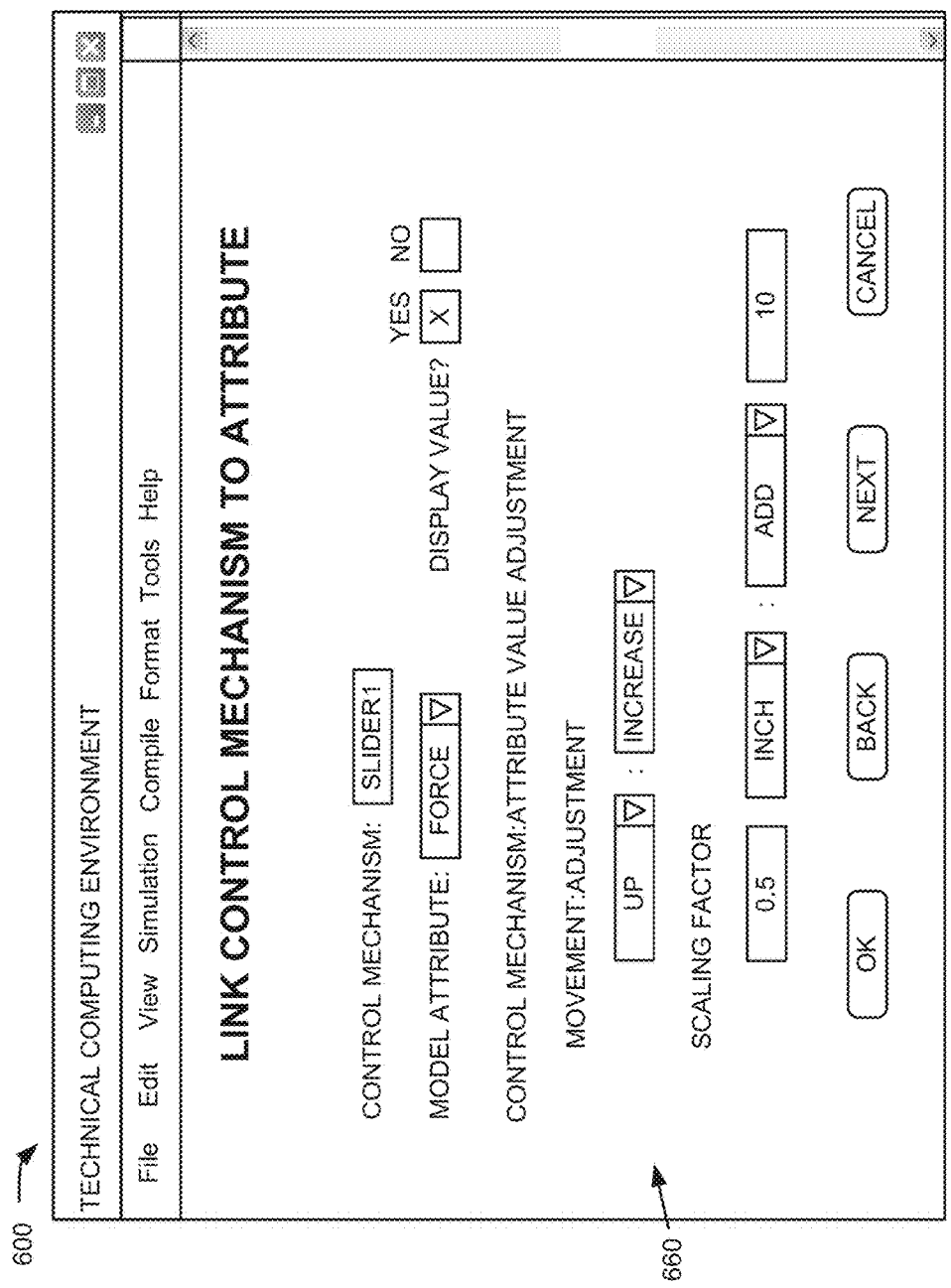

With reference to FIG. 6E, computing device 210 may cause a user interface 660 to be provided to the user. User interface 660 may allow a user to link control mechanism SLIDER1 to the force input to BLOCK3. User interface 660 may also allow the user to specify a scaling factor for the link.

Since the user has selected control mechanism SLIDER1 from user interface 650, user interface 660 may be pre-populated with information identifying the control mechanism. With respect to the model attribute (i.e., the force input), user interface 660 may allow the user to select, via a pull-down menu, a model attribute. In some implementations, the pull-down menu may be pre-populated with all of the attributes that are associated with model 610. In some implementations, the pull-down menu may be pre-populated with a selected set of the attributes that are associated with model 610. For example, the pull-down menu may be pre-populated with attributes, of model 610, that are compatible in terms of units, that are compatible in terms of name, that have been previously used, that are in a certain hierarchy of the model, etc. In either event, the user may simply select an attribute from the pull-down menu. As shown in FIG. 6E, the user has identified the model attribute as FORCE, which corresponds to the force input to BLOCK3.

User interface 660 may also allow the user to specify whether a value of the attribute is to be displayed (e.g., via an output mechanism of an HMI, via a display device associated with computing device 210, via a display device associated with interactive system 220, or via another device). In example 600, the user has specified that the value of the force input to BLOCK3 is to be displayed.

As further shown in FIG. 6E, user interface 660 may allow the user to specify how the value of the model attribute is to be adjusted when the control mechanism is moved in a particular direction. For example, user interface 650 may provide a pull-down menu that allows the user to select a direction of movement, such as up, down, left, right, clockwise, counterclockwise, etc., and whether the value of the attribute is to be increased or decreased based on the identified direction of movement. In example 600, the user has indicated that when control mechanism SLIDER1 is moved up, the value of the model attribute (i.e., the force input to BLOCK3) is to be increased.

User interface 660 may also allow the user to specify a scaling factor. For example, with respect to the control mechanism, user interface 660 may allow the user to specify, for the control mechanism, a distance of movement of the control mechanism and a unit of measure (e.g., in inches, millimeters, centimeters, degrees, etc.). With respect to the model attribute, user interface 660 may allow the user to specify a manner in which the model attribute is to be adjusted (e.g., by addition, subtraction, multiplication, division, an equation, etc.) and a value of adjustment. In example 600, the user has indicated that for every 0.5 inches that control mechanism SLIDER1 is moved up, the value of the model attribute (i.e., the force input to BLOCK3) is to be increased by a value of 10.

Once the user has created the link between control mechanism SLIDER1 and the force input, the user may elect to link other control mechanisms of HMI 640 to other attributes of model 610 by selecting the NEXT button in user interface 660. Once all desired control mechanisms have been linked model attributes, the user may select the OK button in user interface 660.

Assume that the user has linked control mechanisms, of HMI 640, with model attributes and selected the OK button. With reference to FIG. 6F, computing device 210 may provide a user interface 670 that allows the user to verify the links that have been created. If any of the links, identified in user interface 670, are incorrect, the user may select the BACK button to return to user interface 660 and correct the incorrect link. If, on the other hand, the links, in user interface 660, are correct, the user may select the OK button to create the indicated links.

Figure 7:
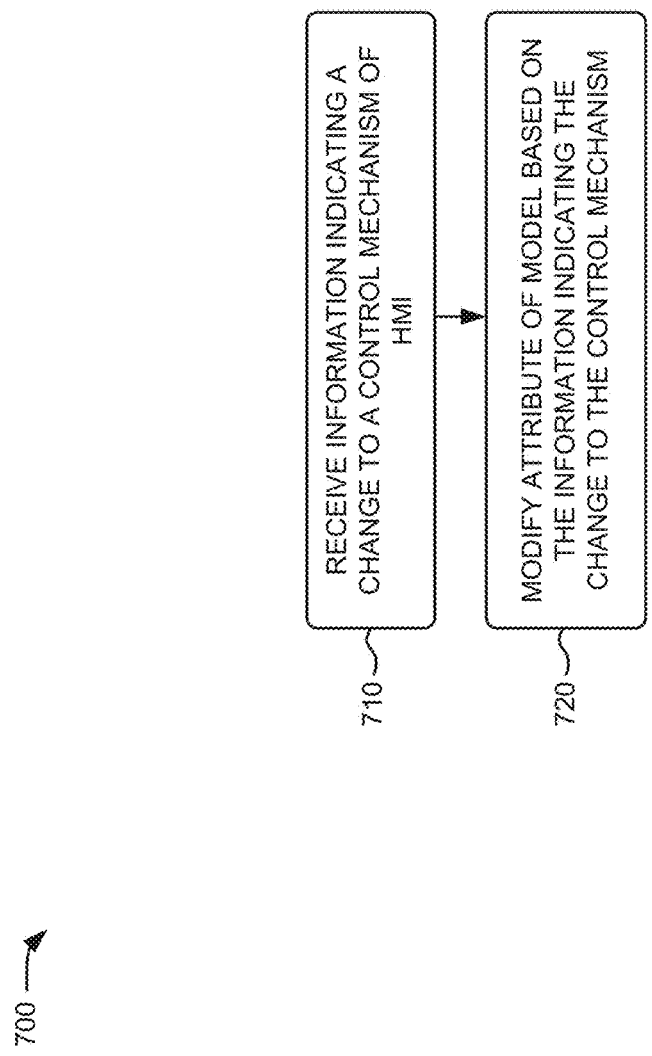
FIG. 7 is a flowchart of an example process for modifying an attribute of a model using a control mechanism of a HMI.

FIG. 7 is a flowchart of an example process 700 for modifying an attribute of a model using a control mechanism of an HMI. In some implementations, process 700 may be performed by computing device 210. In some implementations, one or more blocks of process 700 may be performed by one or more devices instead of, or possibly in conjunction with, computing device 210.

With respect to process 700, assume that a user has opened a model in a technical computing environment, such as TCE 215. For example, computing device 210 (e.g., TCE 215) may receive a request, from a user of computing device 210, to access a model. The request may include information identifying the model, such as a name of the model, and information identifying a memory location at which the model is stored. The memory location may be located within computing device 210 or external to, and possibly remote from, computing device 210. Computing device 210 may, based on receiving the request, retrieve the model from the memory location. In some implementations, computing device 210 may provide, for display, a user interface that depicts all or a portion of the model.

In addition, assume that either the user has provided an HMI, which has been linked to the model, within the spatial environment being monitored by an interactive system, such as interactive system 220, or that an HMI was automatically generated within the spatial environment (e.g., as a virtual representation). In either event, interactive system 220 may provide information to computing device 210 indicating that the HMI is within the spatial environment.

Process 700 may include receiving information indicating a change to a control mechanism of the HMI (block 710). For example, interactive system 220 may monitor the user's interaction with the control mechanism and capture information relating to the interaction. For example, in those situations where the control mechanism is a rotating mechanism, interactive system 220 may capture information indicating a direction of rotation of the rotating mechanism and a degree that the control mechanism was rotated. In those situations where the control mechanism is a sliding mechanism, interactive system 220 may capture information indicating a direction of movement of the sliding mechanism and an amount that the control mechanism was moved. In those situations where the control mechanism is a pushing mechanism, interactive system 220 may capture information indicating that the pushing mechanism has been pushed and possibly the quantity of times that the pushing mechanism has been pushed. In those situations where the control mechanism is a switching mechanism, interactive system 220 may capture information indicating that the switching mechanism has been moved to a different a position.

In some implementations, interactive system 220 may capture the information relating to the user's interaction with the control mechanism prior to the model being executed. In some implementations, interactive system 220 may capture the information relating to the user's interaction with the control mechanism while the model is being executed. In any event, interactive system 220 may provide information relating to the interaction to computing device 210. Computing device 210 (e.g., TCE 215) may receive the information from interactive system 220.

Process 700 may include modifying the attribute of the model based on the information indicating a change to the control mechanism (block 720). For example, computing device 210 (e.g., TCE 215) may cause, in response to the received information from interactive system 220, particular actions to be performed in relation to the attribute of the model. For example, computing device 210 may cause a value of the attribute to be increased or decreased. In some implementations, the new value of the attribute may be displayed by the HMI. For example, computing device 210 may transmit the new value of the attribute to HMI and HMI may display the new value via an output mechanism, such as a digital readout, a rotary gauge, or another output mechanism.

In some implementations, the information indicating a change to a control mechanism may affect the model in other ways (in addition or as an alternative to modifying a value of an attribute of the model to which the control mechanism is linked). For example, receipt of the information indicating a change to a control mechanism may cause computing device 210 to generate a synchronous or asynchronous event. As an example, pushing a button on the HMI may cause computing device 210 to generate an event that causes the model to change the state of a state transition diagram (e.g., from a normal operation to an emergency operation).

While FIG. 7 shows process 700 as including a particular quantity and arrangement of blocks, in some implementations, process 700 may include additional blocks or different blocks.

Figure 8B:
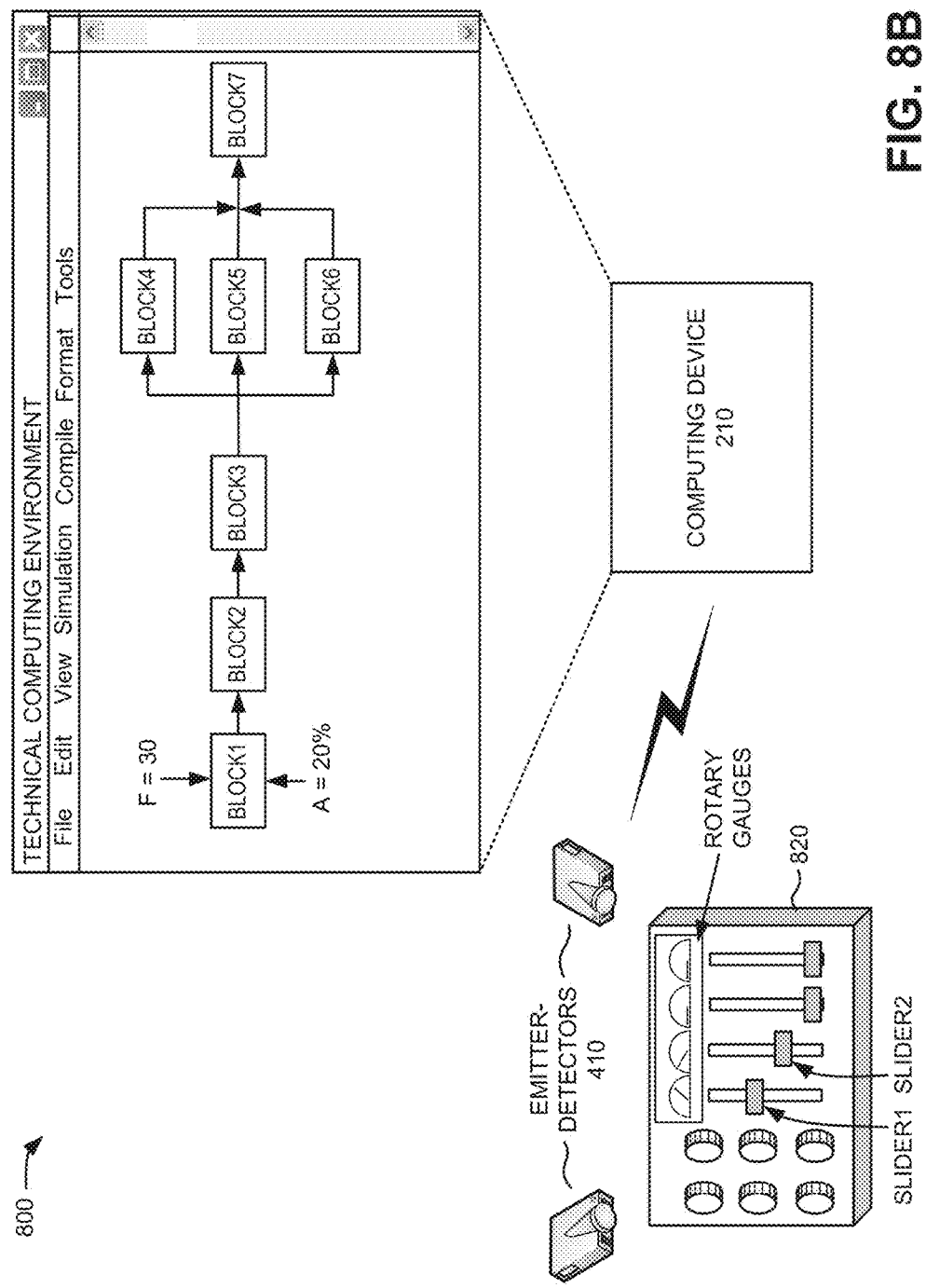

FIGS. 8A and 8B are an example 800 of process 700 described above with respect to FIG. 7. With reference to FIG. 8A, computing device 210 may provide a TCE that includes a model 810. As shown, model 810 may include a group of blocks, identified as BLOCK1, BLOCK2, BLOCK3, BLOCK4, BLOCK5, BLOCK6, and BLOCK7. For example 800, assume that BLOCK1 receives two inputs. Assume further that the first input, F, corresponds to a force and that the second input, A, corresponds to an angle. In addition, assume that the user has linked control mechanisms of an HMI 820 to model 810 to allow the user to control the inputs of BLOCK1. For example, assume that the user has linked SLIDER1 to the force input and linked SLIDER2 to the angle input.

The user may provide HMI 820 to the spatial environment monitored by interactive system 220 (e.g., by emitter-detectors 410). Interactive system 220 may detect the presence of HMI 820 in the spatial environment. Interactive system 220 may detect that SLIDER1 is in a first position, which corresponds to a first value for the force input. Interactive system 220 may also detect that SLIDER2 is in a first position, which corresponds to a first value for the angle input. Interactive system 220 may transmit information relating to the first position of SLIDER1 and the first position of SLIDER2 to computing device 210. Computing device 210 may receive the information relating to the first position of SLIDER1 and determine the first value for force input, which is shown as "0" in FIG. 8A. Computing device 210 may further receive the information relating to the first position of SLIDER2 and determine the first value for angle input, which is shown as "0" in FIG. 8A. Computing device 210 may execute model 810 using the first value of the force input and the first value of the angle input.

Assume at some later point in time, the user wants to adjust the value of the force input and the value of the angle input. With reference to FIG. 8B, the user may change the positions of SLIDER1 and SLIDER2. Interactive system 220 may detect that SLIDER1 is in a second position and that SLIDER2 is in a second position. Interactive system 220 may transmit information relating to the second position of SLIDER1 and the second position of SLIDER2 to computing device 210. Computing device 210 may receive the information relating to the second position of SLIDER1 and determine a new value for force input, which is shown as "30" in FIG. 8B. Computing device 210 may further receive the information relating to the second position of SLIDER2 and determine a new value for angle input, which is shown as "20" in FIG. 8B. As further shown in FIG. 8B, HMI 820 may display the new attribute values. Computing device 210 may execute model 810 using the new value of the force input and the new value of the angle input. In this way, the user may interact with an HMI in a spatial environment to control attributes of a model.

Systems and methods, as described herein, allow a user to link an attribute, of a model of a technical computing environment, to a control mechanism of an HMI in a spatial environment. Using the link, the user may interact with the control mechanism, in the spatial environment, to adjust the attribute prior to or during execution of the model.

The foregoing description provides illustration and description, but is not intended to be exhaustive or to limit the implementations to the precise form disclosed. Modifications and variations are possible in light of the above disclosure or may be acquired from practice of the implementations.

For example, while the foregoing description focused on using a generic HMI to control an attribute of a model, systems and methods, as described herein, are not so limited. For example, a generic HMI may be used to control things other than a model, such as to provide input to a computer program. As one example, the generic HMI may be used to control one or more aspects of a video game. When used in the context of controlling a video game, the generic HMI may take the form of a video game controller. Thus, a user may, for example, create a custom-made video game controller, using 3D printing, and establish links between the control mechanisms of the controller and aspects of the video game.

In addition, while the foregoing description focused on modifying a value of an attribute of the model based on a change to a control mechanism of an HMI, systems and methods, as described herein, are not so limited. For example, in those situations where the HMI is provided as a virtual spatial representation, computing device 210 may modify the virtual spatial representation, during execution of the model, to show information relating to the model. As one example, computing device 210 may cause various positions of a control mechanism, of the HMI, to be shown in a particular color to reflect that those positions have been selected over the course of an execution of the model (e.g., to indicate coverage results).

As used herein, the term component is intended to be broadly interpreted to refer to hardware or a combination of hardware and software, such as software executed by a processor.

It will be apparent that systems and methods, as described above, may be implemented in many different forms of software, firmware, and hardware in the implementations illustrated in the figures. The actual software code or specialized control hardware used to implement these systems and methods is not limiting of the implementations. Thus, the operation and behavior of the systems and methods were described without reference to the specific software code—it being understood that software and control hardware can be designed to implement the systems and methods based on the description herein.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

No element, act, or instruction used in the present application should be construed as critical or essential unless explicitly described as such. Also, as used herein, the article "a" is intended to include one or more items and may be used interchangeably with the phrase "one or more." Where only one item is intended, the term "one" or similar language is used. Further, the phrase "based on" is intended to mean "based, at least in part, on" unless explicitly stated otherwise.

What is claimed is:

1. A non-transitory computer-readable medium for storing instructions, the instructions comprising:
   a plurality of instructions that, when executed by a processor of a computing device, cause the processor to:
   receive a request to create a link between a human machine interface and a model,
   the model, when executed, simulating behavior of a system, and
   the human machine interface being a physical object and including a control mechanism,
   receive, subsequent to receiving the request, information that identifies the control mechanism, receive information that identifies a plurality of attributes of the model,
   cause a user interface to be provided that allows a user to select an attribute, from among the plurality of attributes, and to select the control mechanism to which the attribute is to be linked,
   detect a selection of the attribute to be linked to the control mechanism,
   detect a selection of the control mechanism to be linked to the attribute,
   create the link, based on the selection of the attribute and the selection of the control mechanism, between the human machine interface and the model by linking the control mechanism to the attribute of the model based on the received information identifying the control mechanism and information identifying the attribute included in the received information identifying the plurality of attributes, identify a presence of the human machine interface in a spatial environment, receive, by monitoring the spatial environment, information indicating that the control mechanism has changed, and modify a value, associated with the attribute, to form a modified value of the attribute based on receiving the information indicating the change to the control mechanism and based on the link, the model producing a first result when the model is executed using the value of the attribute, and the model producing a second, different result when the model is executed using the modified value of the attribute.

2. The non-transitory computer-readable medium of claim 1, where the model includes a plurality of model elements, where the attribute corresponds to a model element, of the plurality of model elements, that produces an input.

3. The non-transitory computer-readable medium of claim 1, where the control mechanism includes a rotating mechanism, where the plurality of instructions that cause the processor to receive information indicating that the control mechanism has changed include:

one or more instructions to monitor the rotating mechanism in the spatial environment, one or more instructions to detect that the rotating mechanism has been rotated in a direction based on monitoring the rotating mechanism, and one or more instructions to receive information indicating that the rotating mechanism has been rotated in the direction based on the detecting, and where the plurality of instructions that cause the processor to modify the value associated with the attribute include:

one or more instructions to increase or decrease the value, associated with the attribute, based on the direction.

4. The non-transitory computer-readable medium of claim 3, where the received information indicating that the rotating mechanism has been rotated in the direction includes information indicating an amount of rotation, and where the plurality of instructions that cause the processor to modify the value associated with the attribute include:

one or more instructions to determine a quantity based on the amount of rotation, and one or more instructions to increase or decrease the value, associated with the attribute, based on the quantity.

5. The non-transitory computer-readable medium of claim 1, where the control mechanism includes a sliding mechanism, where the plurality of instructions that cause the processor to receive information indicating that the control mechanism has changed include:

one or more instructions to monitor the sliding mechanism in the spatial environment, one or more instructions to detect that the sliding mechanism has been moved in a direction based on monitoring the sliding mechanism, and one or more instructions to receive information indicating that the sliding mechanism has been moved in the direction based on the detecting, and where the plurality of instructions that cause the processor to modify the value associated with the attribute include:

one or more instructions to increase or decrease the value, associated with the attribute, based on the direction.

6. The non-transitory computer-readable medium of claim 5, where the received information indicating that the sliding mechanism has been moved in the direction includes information indicating an amount of movement, and where the plurality of instructions that cause the processor to modify the value associated with the attribute include:

one or more instructions to determine a quantity based on the amount of movement, and one or more instructions to increase or decrease the value, associated with the attribute, based on the quantity.

7. The non-transitory computer-readable medium of claim 1, where the plurality of instructions to cause the processor to receive the information that identifies the control mechanism include:

one or more instructions to cause an image of the human machine interface and the control mechanism to be displayed in the user interface, one or more instructions to detect selection of the control mechanism in the user interface, and one or more instructions to receive the information identifying the control mechanism based on the detected selection of the control mechanism in the user interface.

8. The non-transitory computer-readable medium of claim 1, where the plurality of instructions that cause the processor to receive the information indicating that the control mechanism has changed and to modify the value associated with the attribute include:

one or more instructions to receive the information indicating that the control mechanism has changed and to modify the value, associated with the attribute, during an execution of the model.

9. A device comprising:

a processor to:

receive a request to create a link between a human machine interface and a model, the model, when executed, simulating behavior of a system, and the human machine interface being a physical object and including a control mechanism, receive, subsequent to receiving the request, information that identifies the control mechanism, receive information that identifies a plurality of attributes of the model, cause a user interface to be provided that allows a user to select an attribute, of the plurality of attributes, and to select the control mechanism to which the attribute is to be linked, detect a selection of the attribute to be linked to the control mechanism, detect a selection of the control mechanism to be linked to the attribute, create the link, based on the selection of the attribute and the selection of the control mechanism, between the human machine interface and the model by linking the control mechanism to the attribute of the model based on the received information identifying the control mechanism and information identifying the attribute included in the received information that identifies the plurality of attributes,
observe the human machine interface in a spatial environment,
receive information, based on observing the human machine interface, indicating that the control mechanism has changed,
modify a value, associated with the attribute, to form a modified value based on receiving the information indicating the change to the control mechanism and based on the link, and
cause the modified value to be displayed.

10. The device of claim 9, where the human machine interface includes a human machine interface produced via three dimensional (3D) printing.

11. The device of claim 9, where, when causing the modified value to be displayed, the processor is to:
cause the modified value to be displayed by the human machine interface.

12. The device of claim 9, where the control mechanism includes a rotating mechanism,
where, when observing the human machine interface, the processor is to:
determine that the rotating mechanism has been rotated in a direction,
where, when receiving the information indicating that the control mechanism has changed, the processor is to:
receive information indicating the direction, and
where, when modifying the value associated with the attribute, the processor is to:
increase or decrease the value, associated with the attribute, based on the information indicating the direction of rotation.

13. The device of claim 12, where the received information indicating that the control mechanism has changed further includes information indicating a quantity of rotation, and
where, when modifying the value associated with the attribute, the processor is to:
increase or decrease the value, associated with the attribute, based on the quantity of rotation.

14. The device of claim 9, where the control mechanism includes a sliding mechanism,
where, when observing the human machine interface, the processor is to:
determine that the sliding mechanism has been moved in a direction, and
where, when receiving the information indicating that the control mechanism has changed, the processor is to:
receive information indicating the direction, and
where, when modifying the value associated with the attribute, the processor is to:
increase or decrease the value, associated with the attribute, based on the information indicating the direction.

15. The device of claim 9, where the processor is further to:
generate the human machine interface based on information relating to the model.

16. A method comprising:
receiving a request to create a link between a control mechanism of a human machine interface and an attribute of a model,
the model, when executed, simulating behavior of a system,
the human machine interface being a physical object,
the receiving the request being performed by a computing device;
providing a user interface that allows a user to select the attribute, from among a plurality of attributes, and to select the control mechanism to which the attribute is to be linked, the providing the user interface being performed by the computing device;
detecting a user selection of the attribute to be linked to the control mechanism,
the detecting the user selection of the attribute being performed by the computing device,
detecting a user selection of the control mechanism to be linked,
the detecting the user selection of the control mechanism being performed by the computing device,
creating the link between the control mechanism and the attribute based on detecting the user selection of the attribute to be linked and the user selection of the control mechanism to be linked,
the creating the link being performed by the computing device;
observing the control mechanism in a spatial environment,
the observing the control mechanism being performed by the computing device;
detecting that the control mechanism has changed based on observing the control mechanism in the spatial environment,
the detecting being performed by the computing device; and
modifying a value, associated with the attribute, based on detecting that the control mechanism has changed and based on the link,
the modifying being performed by the computing device.

17. The method of claim 16, where the human machine interface includes a non-electronic physical object, and
where observing the control mechanism includes:
visually observing the non-electronic physical object in the spatial environment.

18. The method of claim 16, where the control mechanism includes a rotating mechanism,
where detecting that the control mechanism has changed includes:
detecting that the rotating mechanism has been rotated in a direction, and where modifying the value associated with the attribute includes:
increasing or decreasing the value, associated with the attribute, based on the direction.

19. The method of claim 16, where the user interface allows the user to specify how the value, associated with the attribute, is to be adjusted when the control mechanism is moved in a selected direction,
the method further comprising:
detecting a user selection, in the user interface, of how the value is to be adjusted when the control mechanism is moved in the selected direction; and
where modifying the value is based on the user selection of how the value is to be adjusted when the control mechanism is moved in the selected direction.

20. The method of claim 16, where the user interface allows the user to specify a direction of movement for the control mechanism and a scaling factor indicating an amount of change to the value based on a movement in the direction of movement the method further comprising:
  detecting a user selection, in the user interface, of the direction of movement and the scaling factor; and
where modifying the value is based on the user selection of the direction of movement and the scaling factor.

\* \* \* \* \*